(12) United States Patent
Jeong et al.

(10) Patent No.: US 12,127,445 B2
(45) Date of Patent: Oct. 22, 2024

(54) DISPLAY APPARATUS

(71) Applicant: Samsung Display Co., Ltd., Yongin-si (KR)

(72) Inventors: Yugwang Jeong, Yongin-si (KR); Daesoo Kim, Yongin-si (KR); Sungwon Cho, Yongin-si (KR); Subin Bae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 444 days.

(21) Appl. No.: 17/451,880

(22) Filed: Oct. 22, 2021

(65) Prior Publication Data

US 2022/0173184 A1 Jun. 2, 2022

(30) Foreign Application Priority Data

Dec. 2, 2020 (KR) ........................ 10-2020-0166927

(51) Int. Cl.
| | | |
|---|---|---|
| *H01L 27/14* | (2006.01) | |
| *H01L 27/12* | (2006.01) | |
| *H01L 29/786* | (2006.01) | |
| *H10K 59/12* | (2023.01) | |
| *H10K 59/121* | (2023.01) | |

(Continued)

(52) U.S. Cl.
CPC ....... *H10K 59/123* (2023.02); *H01L 27/1225* (2013.01); *H01L 27/124* (2013.01);
(Continued)

(58) Field of Classification Search
CPC ............. H10K 59/123; H10K 59/1213; H10K 59/1216; H10K 59/131; H10K 59/1201;
(Continued)

(56) References Cited

U.S. PATENT DOCUMENTS 7,342,286 B2    3/2008  Shin et al.
7,476,614 B2 *  1/2009  Kwak ............... H01L 21/28531
                                                257/E21.597
(Continued)

FOREIGN PATENT DOCUMENTS

JP      2018-74076 A    5/2018
JP      2020-17558 A    1/2020
(Continued)

OTHER PUBLICATIONS

Dalton, T.J., et al., "Microtrench Formation in Polysilicon Plasma Etching over Thin Gate Oxide," J. Electrochem. Soc., vol. 140, No. 8, Aug. 1993, pp. 2395-2401.

(Continued)

*Primary Examiner* — Tan N Tran
(74) *Attorney, Agent, or Firm* — Lewis Roca Rothgerber Christie LLP

(57) ABSTRACT

A display apparatus includes: a substrate; a first semiconductor layer on the substrate, and including a silicon semiconductor; a second semiconductor layer on the first semiconductor layer, and including an oxide semiconductor; a first conductive layer on the second semiconductor layer; at least one metal layer between the first semiconductor layer and the first conductive layer; and a first contact hole to electrically connect the first semiconductor layer to the first conductive layer. An inner surface of the first contact hole includes a side surface of the at least one metal layer.

23 Claims, 28 Drawing Sheets

(51) Int. Cl.
*H10K 59/123* (2023.01)
*H10K 59/131* (2023.01)
*H10K 71/00* (2023.01)

(52) U.S. Cl.
CPC ...... *H01L 27/1251* (2013.01); *H01L 27/1255* (2013.01); *H01L 29/78648* (2013.01); *H01L 29/78675* (2013.01); *H01L 29/7869* (2013.01); *H10K 59/1201* (2023.02); *H10K 59/1213* (2023.02); *H10K 59/1216* (2023.02); *H10K 59/131* (2023.02); *H10K 71/00* (2023.02)

(58) Field of Classification Search
CPC .. H10K 71/233; H10K 71/00; H01L 27/1225; H01L 27/124; H01L 27/1251; H01L 27/1255; H01L 29/78648; H01L 29/78675; H01L 29/7869; H01L 27/1248
USPC .............................................. 257/59, 72, 774
See application file for complete search history.

(56) References Cited

U.S. PATENT DOCUMENTS 10,317,763 B2   6/2019   Watakabe et al.
2017/0256569 A1   9/2017   Ohara

FOREIGN PATENT DOCUMENTS

KR           10-0607194 B1   8/2006
KR     10-2018-0127293 A     11/2018

OTHER PUBLICATIONS

Watanabe, M., et al., "Reduction of microtrenching and island formation in oxide plasma etching by employing electron beam charge neutralization," Applied Physics Letters, vol. 79, No. 17, Oct. 2001, 4 pages.

* cited by examiner

DISPLAY APPARATUS

CROSS-REFERENCE TO RELATED APPLICATION

This application claims priority to and the benefit of Korean Patent Application No. 10-2020-0166927, filed on Dec. 2, 2020, in the Korean Intellectual Property Office, the disclosure of which is incorporated by reference herein in its entirety.

BACKGROUND

1. Field

Aspects of one or more embodiments of the present disclosure relate to a display apparatus, and more particularly, to a display apparatus in which a high resolution is realized.

2. Description of the Related Art

Mobile electronic devices are widely used. As some examples of the mobile electronic devices, tablet PCs have been widely used in recent years, in addition to small electronic devices, for example, such as mobile phones.

Such mobile electronic devices include a display apparatus to provide various suitable functions to a user, for example, such as providing visual information such as an image and/or a video. Recently, with the miniaturization of components for driving the display apparatus, an area occupied by the display apparatus in the electronic devices has been gradually increasing, and thus, a demand for a high-resolution display apparatus is increasing. Therefore, studies are being actively conducted to achieve a high integration of the display apparatus, and to reduce power consumption of the display apparatus.

The above information disclosed in this Background section is for enhancement of understanding of the background of the present disclosure, and therefore, it may contain information that does not constitute prior art.

SUMMARY

One or more embodiments of the present disclosure are directed to a display apparatus in which a high resolution may be realized through a reduction of power consumption and a high integration thereof. However, the present disclosure is not limited to the above aspects and features.

Additional aspects and features will be set forth, in part, in the description which follows, and in part, will be apparent from the description, or may be learned by practicing one or more of the presented embodiments of the present disclosure.

According to one or more embodiments of the present disclosure, a display apparatus includes: a substrate; a first semiconductor layer on the substrate, and including a silicon semiconductor; a second semiconductor layer on the first semiconductor layer, and including an oxide semiconductor; a first conductive layer on the second semiconductor layer; at least one metal layer between the first semiconductor layer and the first conductive layer; and a first contact hole configured to electrically connect the first semiconductor layer to the first conductive layer. An inner surface of the first contact hole includes a side surface of the at least one metal layer.

In an embodiment, the display apparatus may further include a first gate electrode on the second semiconductor layer, and the at least one metal layer may include a first metal layer at a same layer as that of the first gate electrode.

In an embodiment, the display apparatus may further include a second gate electrode below the second semiconductor layer, and the at least one metal layer may further include a second metal layer at a same layer as that of the second gate electrode.

In an embodiment, the display apparatus may further include a third gate electrode on the first semiconductor layer, and the at least one metal layer may further include a third metal layer at a same layer as that of the third gate electrode.

In an embodiment, the inner surface of the first contact hole may include a first portion on the at least one metal layer, and a second portion below the at least one metal layer, and the first portion of the inner surface may have a tapered shape.

In an embodiment, an angle of the first portion of the inner surface with respect to a surface of the substrate may be different from an angle of the second portion of the inner surface with respect to the surface of the substrate.

In an embodiment, the first conductive layer may contact the side surface of the at least on metal layer in the first contact hole.

In an embodiment, the at least one metal layer may be electrically floated.

In an embodiment, the at least one metal layer may have an opening overlapping with the first contact hole, and an edge of the opening of the at least one metal layer may have a closed-loop shape on a plane.

In an embodiment, the at least one metal layer may have an opening overlapping with the first contact hole, and the at least one metal layer may include a first portion, and a second portion opposite to the first portion with respect to a center of the opening of the at least one metal layer on a plane.

In an embodiment, the at least one metal layer may have an opening overlapping with the first contact hole, and the at least one metal layer may have a bent shape to partially surround the opening of the at least one metal layer on a plane.

In an embodiment, the display apparatus may further include: a second conductive layer at a same layer as that of the first conductive layer; a first electrode at a same layer as that of the second gate electrode; and a second contact hole configured to electrically connect the second conductive layer to the first electrode. An inner surface of the second contact hole may include a side surface of the at least one metal layer.

In an embodiment, the display apparatus may further include: a third conductive layer at a same layer as that of the first conductive layer; and a third contact hole configured to electrically connect the third conductive layer to the second semiconductor layer. An inner surface of the third contact hole may include a side surface of the at least one metal layer.

In an embodiment, the first conductive layer and the third conductive layer may be integrated with each other as one body.

According to one or more embodiments of the present disclosure, a display apparatus includes: a substrate; a first semiconductor layer on the substrate; a first insulating layer on the first semiconductor layer; a second semiconductor layer on the first insulating layer, and including a material different from that of the first semiconductor layer; a second insulating layer on the second semiconductor layer; a conductive layer on the second insulating layer; a first contact hole configured to electrically connect the first semiconductor layer to the conductive layer; and a metal layer between the first semiconductor layer and the conductive layer, the metal layer having an opening overlapping with the first contact hole. The conductive layer is in contact with a side surface of the metal layer in the first contact hole.

In an embodiment, the first semiconductor layer may include a silicon semiconductor layer, and the second semiconductor layer may include an oxide semiconductor layer.

In an embodiment, the display apparatus may further include: a first gate electrode between the second semiconductor layer and the conductive layer, and the metal layer may include a same material as that of the first gate electrode.

In an embodiment, the display apparatus may further include: a second gate electrode between the first semiconductor layer and the second semiconductor layer; and a second metal layer including a same material as that of the second gate electrode.

In an embodiment, the conductive layer may contact a side surface of the second metal layer in the first contact hole.

In an embodiment, the display apparatus may further include: a third gate electrode between the first semiconductor layer and the second semiconductor layer, the third gate electrode being at a different layer from that of the second gate electrode; and a third metal layer including a same material as that of the third gate electrode.

In an embodiment, the conductive layer may contact a side surface of the third metal layer in the first contact hole.

In an embodiment, a side surface of the first contact hole may include a side surface of the first insulating layer, and a side surface of the second insulating layer. The side surface of the second insulating layer may be on the metal layer, and may have a tapered shape.

In an embodiment, the side surface of the first insulating layer may be below the metal layer, and may be located farther from a center of the first contact hole than the side surface of the metal layer.

In an embodiment, an angle of the side surface of the first insulating layer with respect to one surface of the substrate may be different from an angle of the side surface of the second insulating layer with respect to the one surface of the substrate.

In an embodiment, an edge of the opening of the metal layer may have a closed-loop shape on a plane.

In an embodiment, the metal layer may include a first portion, and a second portion opposite to the first portion with respect to a center of the opening of the metal layer on a plane.

In an embodiment, the metal layer may have a bent shape to partially surround the opening of the metal layer on a plane.

Other aspects and features of the present disclosure other than those described above will become apparent from the detailed description, the drawings, and the claims and their equivalents.

The embodiments of the present disclosure may be implemented by using a system, a method, a computer program, or any suitable combinations thereof.

BRIEF DESCRIPTION OF THE DRAWINGS

The above and other aspects and features of the present disclosure will be more clearly understood from the following detailed description of the illustrative, non-limiting example embodiments with reference to the accompanying drawings, in which.

DETAILED DESCRIPTION

Figure 1:
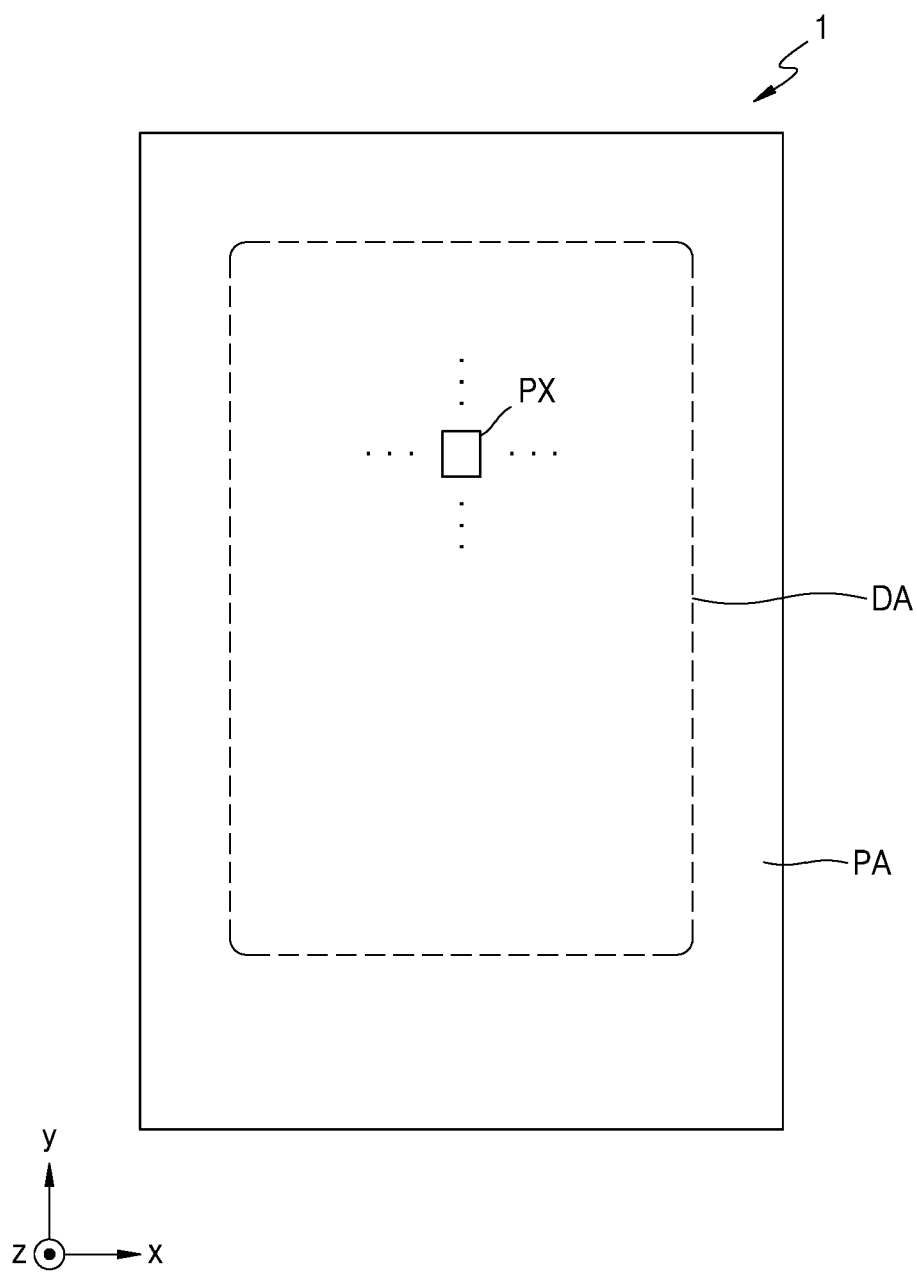
FIG. 1 is a schematic plan view of a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof. Similarly, the expression "at least one of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a display apparatus 1 according to an embodiment.

Referring to FIG. 1, the display apparatus 1 may include a display area DA, and a peripheral area PA outside the display area DA. The display apparatus 1 may provide an image through an array of a plurality of pixels PX that are two-dimensionally arranged at (e.g., in or on) the display area DA.

The peripheral area PA is an area that does not provide an image, and may partially or entirely surround (e.g., around a periphery of) the display area DA. A driver or the like, which provides an electric signal or power to a pixel circuit corresponding to each of the pixels PX, may be arranged at (e.g., in or on) the peripheral area PA. A pad, which is an area to which an electronic element or a printed circuit board may be electrically connected, may be arranged at (e.g., in or on) the peripheral area PA.

A case in which the display apparatus 1 includes an organic light-emitting diode (OLED) as a light-emitting element will be described in more detail below, but the present disclosure is not limited thereto. According to another embodiment, the display apparatus 1 may include a light-emitting display apparatus including an inorganic light-emitting diode, or in other words, an inorganic light-emitting display. The inorganic light-emitting diode may include a PN junction diode including one or more inorganic semiconductor-based materials. When a voltage is applied to the PN junction diode in a forward direction, holes and electrons may be injected, and energy generated by recombination of the holes and electrons may be converted into light energy to emit light of a desired color (e.g., a predetermined or certain color). The above-described inorganic light-emitting diode may have a width of several to hundreds of micrometers, and in some embodiments, the inorganic light-emitting diode may be referred to as a micro-LED. According to another embodiment, the display apparatus 1 may include a quantum dot light-emitting display.

The display apparatus 1 may be used as a display screen for various suitable products, for example, such as for various suitable portable electronic devices, for example, such as mobile phones, smart phones, tablet personal computers (PCs), mobile communication terminals, electronic notebooks, e-books, portable multimedia players (PMPs), navigations, and/or ultra-mobile PCs (UMPCs), as well as for various other suitable electronic devices, for example, such as televisions (TVs), laptops, monitors, billboards, and/or Internet of Things (IoT) devices. The display apparatus 1 according to an embodiment may also be used in various suitable wearable devices, for example, such as smart watches, watch phones, glasses-type displays, and/or head mounted displays (HMDs). The display apparatus 1 according to an embodiment may also be used as dashboards of automobiles, center information displays (CIDs) of the center fascia or dashboards of automobiles, room mirror displays that replace the side mirrors of automobiles, and/or display screens arranged on the rear sides of front seats of automobiles to serve as entertainment devices for back seat passengers of the automobiles.

Figure 2:
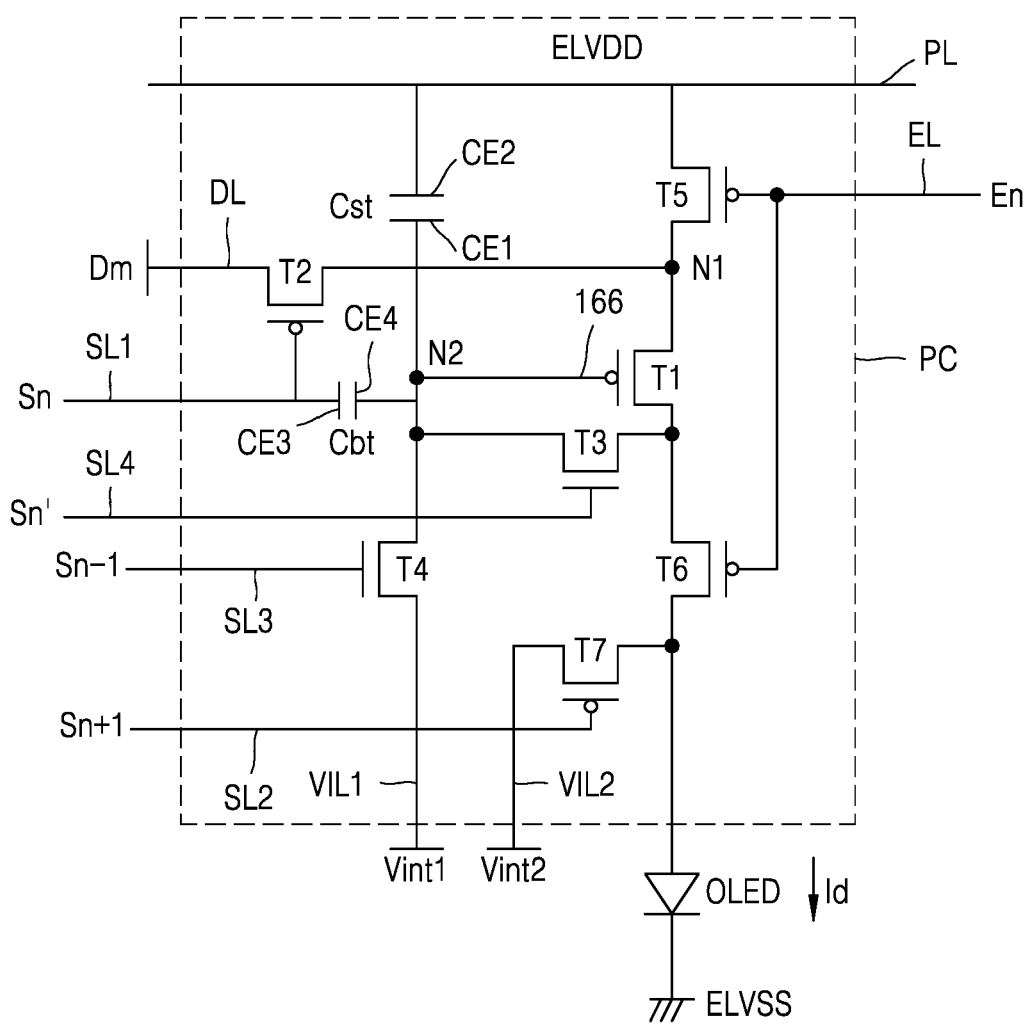
FIG. 2 is an equivalent circuit diagram of a pixel circuit included in a display apparatus, according to an embodiment.

FIG. 2 is an equivalent circuit diagram of a pixel circuit (e.g., of one pixel circuit) PC included in a display apparatus, according to an embodiment.

Referring to FIG. 2, the pixel circuit PC may include first to seventh transistors T1, T2, T3, T4, T5, T6, and T7, a first capacitor Cst, and a second capacitor Cbt. The pixel circuit PC may be connected to a plurality of signal lines, first and second initialization voltage lines VIL1 and VIL2, and a power supply voltage line PL. The signal lines may include a data line DL, a first scan line SL1, a second scan line SL2, a third scan line SL3, a fourth scan line SL4, and an emission control line EL. In another embodiment, at least one of the signal lines, the first and second initialization voltage lines VIL1 and VIL2, and/or the power supply voltage line PL may be shared with neighboring pixel circuits (e.g., adjacent pixel circuits).

The power supply voltage line PL may be configured to transmit a first power supply voltage ELVDD to the first transistor T1. The first initialization voltage line VIL1 may be configured to transmit, to the pixel circuit PC, a first initialization voltage Vint1 that initializes the first transistor T1. The second initialization voltage line VIL2 may be configured to transmit, to the pixel circuit PC, a second initialization voltage Vint2 that initializes an organic light-emitting diode OLED.

As an example, FIG. 2 illustrates that the third transistor T3 and the fourth transistor T4 from among the first to seventh transistors T1 to T7 are implemented as n-channel metal-oxide-semiconductor field effect transistors (MOSFET) (NMOSs), and the other transistors thereamong are implemented as p-channel MOSFETs (PMOSs), but the present disclosure is not limited thereto.

The first transistor T1 may be electrically connected to the power supply voltage line PL through the fifth transistor T5, and may be electrically connected to the organic light-emitting diode OLED through the sixth transistor T6. The first transistor T1 may serve as a driving transistor, and may be configured to receive a data signal Dm according to a switching operation of the second transistor T2 to supply a driving current Id to the organic light-emitting diode OLED.

The second transistor T2 may serve as a switching transistor, and may be connected to the first scan line SL1, and the data line DL. The second transistor T2 may be connected to the power supply voltage line PL through the fifth transistor T5. The second transistor T2 may be turned on in response to a first scan signal Sn received through the first scan line SL1, and may perform the switching operation to transmit, to a first node N1, the data signal Dm transmitted to the data line DL.

The third transistor T3 may serve as a compensation transistor, and may be connected to the fourth scan line SL4. The third transistor T3 may be connected to the organic light-emitting diode OLED through the sixth transistor T6. The third transistor T3 may be turned on in response to a fourth scan signal Sn' received through the fourth scan line SL4, and may diode-connect the first transistor T1.

The fourth transistor T4 may serve as a first initialization transistor, and may be connected to the first initialization voltage line VIL1. The fourth transistor T4 may be connected to the third scan line SL3, which is a previous scan line, and may be turned on in response to a third scan signal Sn−1, which is a previous scan signal, received through the third scan line SL3. The fourth transistor T4 may be configured to transmit the first initialization voltage Vint1 from the first initialization voltage line VIL1 to a gate electrode of the first transistor T1, so as to initialize a voltage of the gate electrode of the first transistor T1.

The fifth transistor T5 may serve as an operation control transistor, and the sixth transistor T6 may serve as an emission control transistor. The fifth transistor T5 and the sixth transistor T6 may be connected to the emission control line EL, and may be concurrently (e.g., simultaneously) turned on in response to an emission control signal En received through the emission control line EL to form a current path, so that the driving current Id flows from the power supply voltage line PL toward the organic light-emitting diode OLED.

The seventh transistor T7 may serve as a second initialization transistor, and may be connected to the second initialization voltage line VIL2. The seventh transistor T7 may be connected to the second scan line SL2, which is a next scan line, and may be turned on in response to a second scan signal Sn+1, which is a next scan signal, received through the second scan line SL2. The seventh transistor T7 may be configured to transmit the second initialization voltage Vint2 from the second initialization voltage line VIL2 to the organic light-emitting diode OLED, so as to initialize the organic light-emitting diode OLED. However, the present disclosure is not limited thereto, and the seventh transistor T7 may be omitted as needed or desired.

The first capacitor Cst may include a first electrode CE1, and a second electrode CE2. The first electrode CE1 may be connected to the gate electrode of the first transistor T1, and the second electrode CE2 may be connected to the power supply voltage line PL. The first capacitor Cst may be configured to store and maintain or substantially maintain a voltage corresponding to a difference between voltages of the power supply voltage line PL and the gate electrode of the first transistor T1, so that the voltage applied to the gate electrode of the first transistor T1 may be maintained or substantially maintained.

The second capacitor Cbt may include a third electrode CE3, and a fourth electrode CE4. The third electrode CE3 may be connected to the first scan line SL1, and a gate electrode of the second transistor T2. The fourth electrode CE4 may be connected to the gate electrode of the first transistor T1, and the first electrode CE1 of the first capacitor Cst. The second capacitor Cbt may serve as a boosting capacitor. When the first scan signal Sn of the first scan line SL1 is a voltage that turns off the second transistor T2, the second capacitor Cbt may boost a voltage of a node N2, so that a voltage indicating black (e.g., a black voltage) is reduced.

The organic light-emitting diode OLED may include a pixel electrode, and an opposite electrode. The opposite electrode may be configured to receive a second power supply voltage ELVSS. The organic light-emitting diode OLED may be configured to receive the driving current Id from the first transistor T1, and may emit light to display an image.

According to an embodiment, an operation of each pixel circuit PC is described in more detail hereinafter.

During a first initialization period, the third scan signal Sn−1 may be supplied through the third scan line SL3, the fourth transistor T4 may be turned on in response to the third scan signal Sn−1, and the first transistor T1 may be initialized by the first initialization voltage Vint1 supplied from the first initialization voltage line VIL1.

During a data programming period, the first scan signal Sn and the fourth scan signal Sn' may be supplied through the first scan line SL1 and the fourth scan line SL4, respectively, and the second transistor T2 and the third transistor T3 may be turned on in response to the first scan signal Sn and the fourth scan signal Sn'. The first transistor T1 may be diode-connected by the turned-on third transistor T3, and may be biased in a forward direction. A voltage obtained by compensating for a threshold voltage (Vth) of the first transistor T1 in the data signal Dm supplied from the data line DL may be applied to the gate electrode of the first transistor T1. The first power supply voltage ELVDD and a compensation voltage may be applied to opposite terminals (e.g., to opposite electrodes CE1 and CE2) of the first capacitor Cst, and charges corresponding to a voltage difference between both terminals (e.g., between both electrodes CE1 and CE2) of the first capacitor Cst may be stored in the first capacitor Cst.

During an emission period, the fifth transistor T5 and the sixth transistor T6 may be turned on by the emission control signal En supplied from the emission control line EL. The driving current Id occurs according to a voltage difference between the voltage of the gate electrode of the first transistor T1 and the first power supply voltage ELVDD, and the driving current Id may be supplied to the organic light-emitting diode OLED through the sixth transistor T6.

During a second initialization period, the second scan signal Sn+1 may be supplied through the second scan line SL2, the seventh transistor T7 may be turned on in response to the second scan signal Sn+1, and the organic light-emitting diode OLED may be initialized by the second initialization voltage Vint2 supplied from the second initialization voltage line VIL2.

In an embodiment, each of the first to seventh transistors T1 to T7 may include a silicon-based transistor including a silicon semiconductor. In another embodiment, at least one of the first to seventh transistors T1 to T7 may include an oxide-based transistor including an oxide semiconductor, and the others thereamong may include a silicon-based transistor including a silicon semiconductor. In more detail, the first transistor T1 that directly influences the brightness of the display apparatus may be provided as a silicon-based transistor including a silicon-based semiconductor layer including polycrystalline silicon with high reliability. In this case, a high-resolution display apparatus may be implemented.

Because the oxide semiconductor has high carrier mobility and low leakage current, a voltage drop may not be great even when the driving time is long. In other words, because a color change of an image due to a voltage drop may not be great even during low-frequency driving, the low-frequency driving may be enabled. As such, the oxide semiconductor has a small leakage current. Therefore, when at least one of the third transistor T3 and/or the fourth transistor T4, which are connected to the gate electrode of the first transistor T1, include the oxide semiconductor, the leakage current that may flow into the gate electrode of the first transistor T1 may be prevented or reduced, and power consumption may also be reduced.

For convenience of description, a case in which the first transistor T1, the second transistor T2, the fifth transistor T5, the sixth transistor T6, and the seventh transistor T7 are provided as silicon-based thin-film transistors including a silicon semiconductor, and the third transistor T3 and the fourth transistor T4 are provided as oxide-based transistors including an oxide semiconductor will be described in more detail below.

Figure 3:
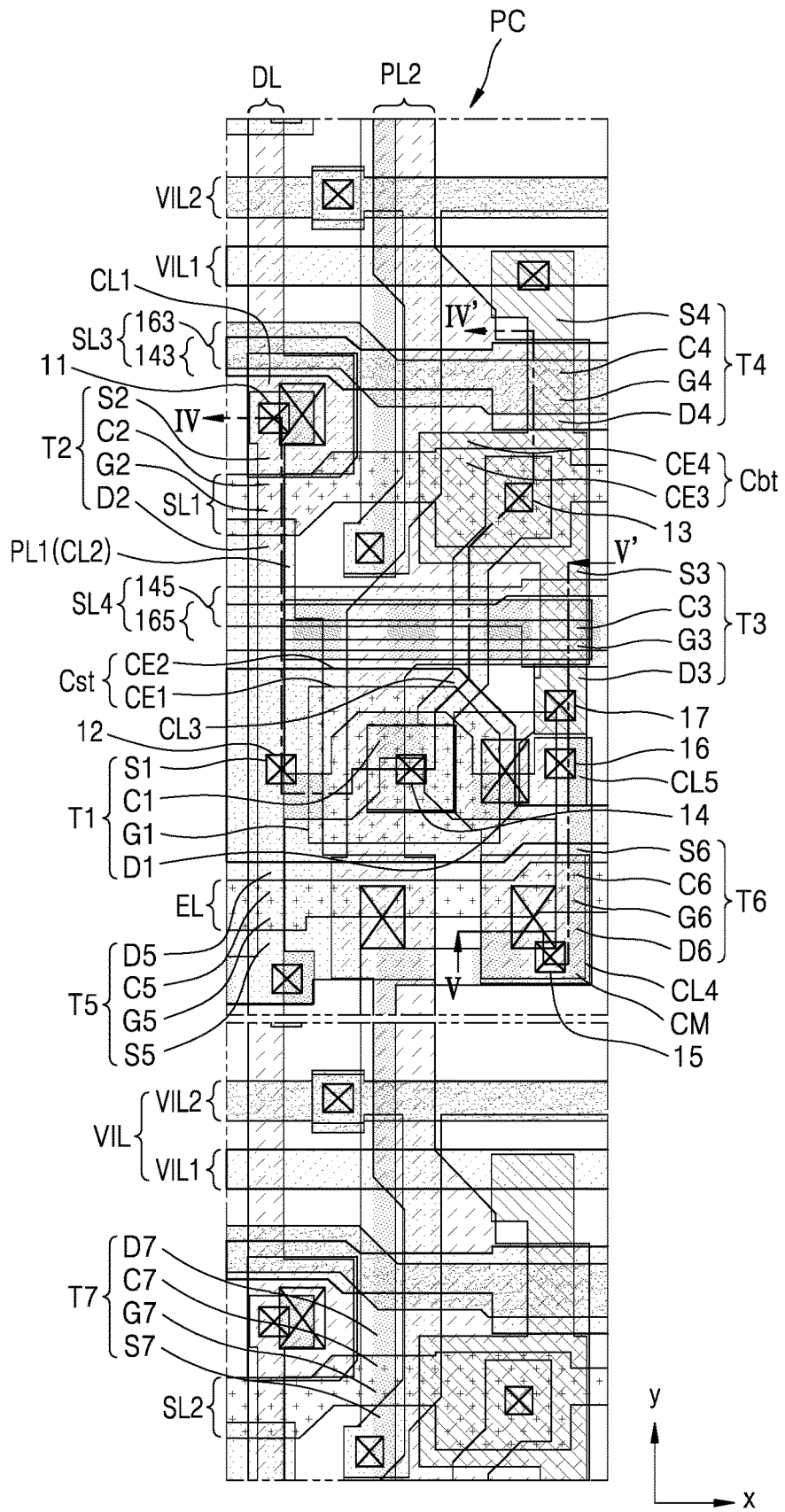
FIG. 3 is a schematic layout diagram of a pixel circuit included in a display apparatus, according to an embodiment.

FIG. 3 is a schematic layout diagram of a pixel circuit (e.g., one pixel circuit) PC included in a display apparatus, according to an embodiment.

Referring to FIG. 3, the pixel circuit PC of the display apparatus 1 (e.g., see FIG. 1), according to an embodiment, may include a first scan line SL1, a second scan line SL2, a third scan line SL3, a fourth scan line SL4, an emission control line EL, a first initialization voltage line VIL1, and a second initialization voltage line VIL2, which extend in a first direction (e.g., the x-direction). The pixel circuit PC may further include a data line DL, and a power supply voltage line PL, which extend in a second direction (e.g., the y-direction) intersecting with (e.g., crossing) the first direction (x-direction). The power supply voltage line PL may include a first power supply voltage line PL1, and a second power supply voltage line PL2.

Also, the pixel circuit PC may include a first transistor T1, a second transistor T2, a third transistor T3, a fourth transistor T4, a fifth transistor T5, a sixth transistor T6, a seventh transistor T7, a first capacitor Cst, and a second capacitor Cbt.

The pixel circuit PC may be repeatedly arranged along rows and columns. FIG. 3 illustrates a portion of a pixel circuit of a current row, and a portion of a pixel circuit of a next row, which are arranged in one column (e.g., in the same column as each other). The second scan line SL2 may be a first scan line SL1 of the next row. In other words, the first scan line SL1 illustrated in FIG. 3 may be a second scan line SL2 of a previous row. Both the seventh transistor T7 connected to a pixel circuit of the previous row and arranged in a pixel area of the current row and the seventh transistor T7 connected to a pixel circuit of the current row and arranged in a pixel area of the next row are illustrated in FIG. 3. In this case, an area in which one pixel circuit is arranged is defined as one pixel area. Hereinafter, for convenience of illustration and description, the seventh transistor T7 arranged in the pixel area of the next row will be described in more detail as an example.

The semiconductor layers of the first transistor T1, the second transistor T2, the fifth transistor T5, the sixth transistor T6, and the seventh transistor T7 are arranged at (e.g., in or on) the same layer as each other, and include the same material as each other. For example, the semiconductor layers may include polycrystalline silicon. The semiconductor layers of the first transistor T1, the second transistor T2, the fifth transistor T5, the sixth transistor T6, and the seventh transistor T7 may be connected to each other, and may be bent in various suitable shapes.

Each of the semiconductor layers of the first transistor T1, the second transistor T2, the fifth transistor T5, the sixth transistor T6, and the seventh transistor T7 may include a channel region, and a source region and a drain region at (e.g., in or on) opposite sides of the channel region. For example, each of the source region and the drain region may be doped with impurities, and the impurities may include N-type impurities or P-type impurities. The source region and the drain region may correspond to a source electrode and a drain electrode, respectively, of the corresponding transistor. The source region and the drain region may be switched with each other according to characteristics of the corresponding transistor. Hereinafter, the terms "source region" and "drain region" may be used instead of the terms "source electrode" and "drain electrode," respectively.

The first transistor T1 may include a first semiconductor layer, and a first gate electrode G1. The first semiconductor layer may include a first channel region C1, and a first source region S1 and a first drain region D1 at (e.g., in or on) opposite sides of the first channel region C1. The first semiconductor layer may have a curved shape. Because the first semiconductor layer has the curved shape, the first channel region C1 may be longer than other channel regions C2, C3, C4, C5, C6, and C7. For example, the first semiconductor layer may be bent a plurality of times, for example, such as in an "S" shape, an "M" shape, or a "W" shape, thereby forming a longer channel length in a narrow space. Because the first channel region C1 is formed to be long, a driving range of a gate voltage applied to the first gate electrode G1 may be widened. Therefore, the gradation of light emitted from the organic light-emitting diode OLED may be controlled more precisely, thereby improving display quality. However, the present disclosure is not limited thereto, and in some embodiments, the first semiconductor layer may have a straight shape instead of a bent shape. The first gate electrode G1 may be provided to overlap with the first channel region C1 in an isolated type.

The first capacitor Cst may be arranged to overlap with the first transistor T1. The first capacitor Cst may include a first electrode CE1, and a second electrode CE2. The first gate electrode G1 may function not only as a control electrode of the first transistor T1, but also as the first electrode CE1 of the first capacitor Cst. In other words, the first gate electrode G1 and the first electrode CE1 may be formed as one body. The second electrode CE2 of the first capacitor Cst may be provided to overlap with the first electrode CE1 with an insulating layer therebetween. In this case, the insulating layer may serve as a dielectric layer of the first capacitor Cst.

The second transistor T2 may include a second semiconductor layer, and a second gate electrode G2. The second semiconductor layer may include a second channel region C2, and a second source region S2 and a second drain region D2 at (e.g., in or on) opposite sides of the second channel region C2. The second source region S2 may be connected to the data line DL through a first conductive layer CL1, and the second drain region D2 may be connected to the first source region S1. In this case, the first conductive layer CL1 may be connected to the second source region S2 through a first contact hole 11. The second gate electrode G2 may be provided as a portion of the first scan line SL1.

The fifth transistor T5 may include a fifth semiconductor layer, and a fifth gate electrode G5. The fifth semiconductor layer may include a fifth channel region C5, and a fifth source region S5 and a fifth drain region D5 at (e.g., in or on) opposite sides of the fifth channel region C5. The fifth source region S5 may be electrically connected to the first power supply voltage line PL1, and the fifth drain region D5 may be connected to the first source region S1. The fifth gate electrode G5 may be provided as a portion of the emission control line EL.

The sixth transistor T6 may include a sixth semiconductor layer, and a sixth gate electrode G6. The sixth semiconductor layer may include a sixth channel region C6, and a sixth source region S6 and a sixth drain region D6 at (e.g., in or on) opposite sides of the sixth channel region C6. The sixth source region S6 may be connected to the first drain region D1, and the sixth drain region D6 may be electrically connected to a pixel electrode 310 (e.g., see FIGS. 4 and 5) of the organic light-emitting diode OLED through a fourth conductive layer CL4 and a connection electrode CM. In this case, the fourth conductive layer CL4 may be connected to the sixth drain region D6 through a fifth contact hole 15. The sixth gate electrode G6 may be provided as a portion of the emission control line EL.

The seventh transistor T7 may include a seventh semiconductor layer, and a seventh gate electrode G7. The seventh semiconductor layer may include a seventh channel region C7, and a seventh source region S7 and a seventh drain region D7 at (e.g., in or on) opposite sides of the seventh channel region C7. The seventh source region S7 may be electrically connected to the second initialization voltage line VIL2, and the seventh drain region D7 may be connected to the sixth drain region D6. The seventh gate electrode G7 may be provided as a portion of the second scan line SL2.

A first interlayer insulating layer 114 (e.g., see FIGS. 4 and 5) may be arranged on the first, second, fifth, sixth, and seventh transistors T1, T2, T5, T6, and T7, each including a silicon semiconductor. The third and fourth transistors T3 and T4, each including an oxide semiconductor, may be arranged on the first interlayer insulating layer 114.

Each of the semiconductor layers of the third transistor T3 and the fourth transistor T4 may include a channel region, and a source region and a drain region at (e.g., in or on) opposite sides of the channel region. For example, the source region and the drain region may be formed by adjusting the carrier concentration of the oxide semiconductor to make the source and drain regions conductive. For example, the source regions and the drain regions of the third transistor T3 and the fourth transistor T4 may be formed by increasing the carrier concentration through plasma treatment using hydrogen (H)-based gas, fluorine (F)-based gas, or a combination thereof on the oxide semiconductor. The source region and the drain region may correspond to a source electrode and a drain electrode, respectively, of the corresponding transistor. Hereinafter, the terms "source region" and "drain region" are used instead of the terms "source electrode" and "drain electrode," respectively.

The third transistor T3 may include a third semiconductor layer including an oxide semiconductor, and a third gate electrode G3. The third semiconductor layer may include a third channel region C3, and a third source region S3 and a third drain region D3 at (e.g., in or on) opposite sides of the third channel region C3. The third source region S3 may be bridged to the first gate electrode G1 through a third conductive layer CL3. Also, the third source region S3 may be connected to a fourth drain region D4 arranged at (e.g., in or on) the same layer as each other. The third drain region D3 may be electrically connected to the first drain region D1 of the first transistor T1, and the sixth source region S6 of the sixth transistor T6. For example, the third drain region D3 may be bridge-connected to the first drain region D1 and the sixth source region S6 through a fifth conductive layer CL5. In this case, the fifth conductive layer CL5 may be connected to the first drain region D1 or the sixth source region S6 through a sixth contact hole 16, and may be connected to the third drain region D3 through a seventh contact hole 17. The third gate electrode G3 may be provided as a portion of the fourth scan line SL4.

The fourth transistor T4 may include a fourth semiconductor layer including an oxide semiconductor, and a fourth gate electrode G4. The fourth semiconductor layer may include a fourth channel region C4, and a fourth source region S4 and the fourth drain region D4 at (e.g., in or on) opposite sides of the fourth channel region C4. The fourth source region S4 may be electrically connected to the first initialization voltage line VIL1, and the fourth drain region D4 may be bridge-connected to the first gate electrode G1 through the third conductive layer CL3. In this case, the third conductive layer CL3 may be connected to the fourth drain region D4 through a third contact hole 13. The fourth gate electrode G4 may be provided as a portion of the third scan line SL3.

A third gate insulating layer 116 (e.g., see FIGS. 4 and 5) may be arranged to correspond to the channel region between the third semiconductor layer and the third gate electrode G3, and the channel region between the fourth semiconductor layer and the fourth gate electrode G4.

The third electrode CE3 of the second capacitor Cbt may be provided as a portion of the first scan line SL1, and may be connected to the second gate electrode G2 of the second transistor T2. The fourth electrode CE4 of the second capacitor Cbt may be arranged to overlap with the third electrode CE3, and may include an oxide semiconductor. The fourth electrode CE4 may be provided at (e.g., in or on) the same layer as those of the third semiconductor layer of the third transistor T3 and the fourth semiconductor layer of the fourth transistor T4, and may be an area between the third semiconductor layer and the fourth semiconductor layer. As another example, the fourth electrode CE4 may extend from the fourth semiconductor layer. As another example, the fourth electrode CE4 may extend from the third semiconductor layer.

The second electrode CE2 may be electrically connected to the first power supply voltage line PL1, and the first power supply voltage line PL1 may be electrically connected to the second power supply voltage line PL2. Hereinafter, the first power supply voltage line PL1 may also be referred to as a second conductive layer CL2. The second conductive layer CL2 may be connected to the second electrode CE2 through a second contact hole 12. The first power supply voltage line PL1 and the second power supply voltage line PL2 may extend in the second direction (y-direction). The second electrode CE2 may extend in the first direction (x-direction), and may transmit the first power supply voltage ELVDD in the first direction (x-direction). Therefore, a plurality of first power supply voltage lines PL1 and second power supply voltage lines PL2 and a plurality of second electrodes CE2 at (e.g., in or on) the display area DA may form a mesh structure.

The third conductive layer CL3 may be electrically connected to the first electrode CE1, the third semiconductor layer of the third transistor T3, and the fourth semiconductor layer of the fourth transistor T4. In this case, the third conductive layer CL3 may be connected to the first electrode CE1 through a fourth contact hole 14.

In an embodiment, some wires may include two conductive layers arranged at (e.g., in or on) different layers from each other. For example, the third scan line SL3 may include a lower scan line 143 and an upper scan line 163 that are arranged at (e.g., in or on) different layers from each other. The lower scan line 143 may be arranged at (e.g., in or on) the same layer as that of the second electrode CE2 of the first capacitor Cst, and may include the same material as that of the second electrode CE2 of the first capacitor Cst. The lower scan line 143 may be arranged to at least partially overlap with the upper scan line 163. The lower scan line 143 and the upper scan line 163 may correspond to a portion of the fourth gate electrode G4 of the fourth transistor T4. Therefore, the fourth transistor T4 may have a double gate structure including control electrodes above and below the semiconductor layer, respectively.

Also, the fourth scan line SL4 may include a lower scan line 145 and an upper scan line 165 that are arranged at (e.g., in or on) different layers from each other. The lower scan line 145 may be arranged at (e.g., in or on) the same layer that of as the second electrode CE2 of the first capacitor Cst, and may include the same material as that of the second electrode CE2 of the first capacitor Cst. The lower scan line 145 may be arranged to at least partially overlap with the upper scan line 165. The lower scan line 145 and the upper scan line 165 may correspond to a portion of the third gate electrode G3 of the third transistor T3. Therefore, the third transistor T3 may have a double gate structure including control electrodes above and below the semiconductor layer, respectively.

For example, an initialization voltage line VIL may include the first initialization voltage line VIL1 and the second initialization voltage line VIL2 that are arranged at (e.g., in or on) different layers from each other. The first initialization voltage line VIL1 may be arranged at (e.g., in or on) the same layer as that of the second electrode CE2 of the first capacitor Cst, and may include the same material as that of the second electrode CE2 of the first capacitor Cst. The second initialization voltage line VIL2 may be arranged at (e.g., in or on) the same layer as that of the first power supply voltage line PL1, and include the same material as that of the first power supply voltage line PL1.

Figure 4:
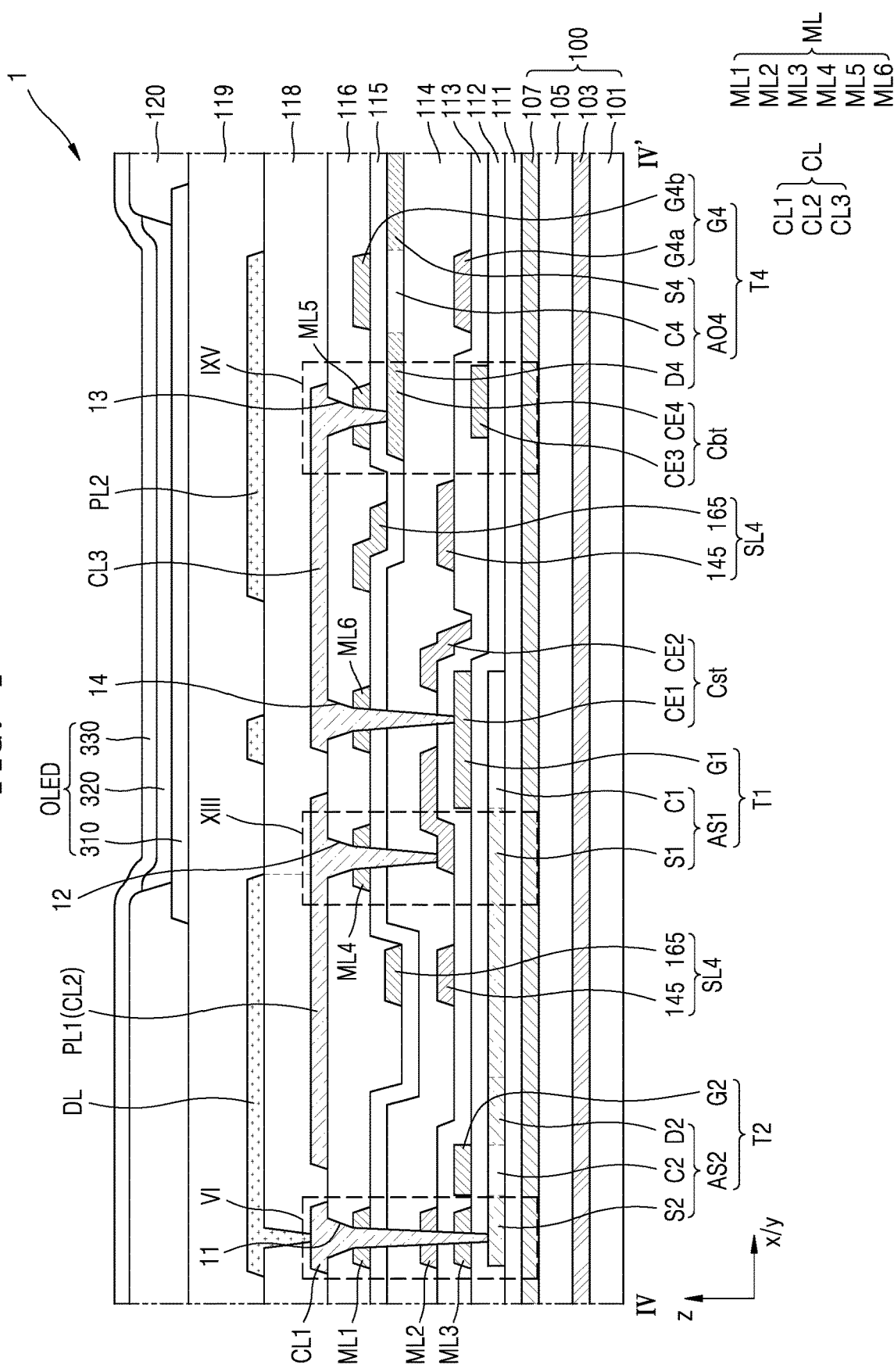
FIG. 4 is a schematic cross-sectional view of a portion of a display apparatus taken along the line IV-IV' of FIG. 3.
Figure 5:
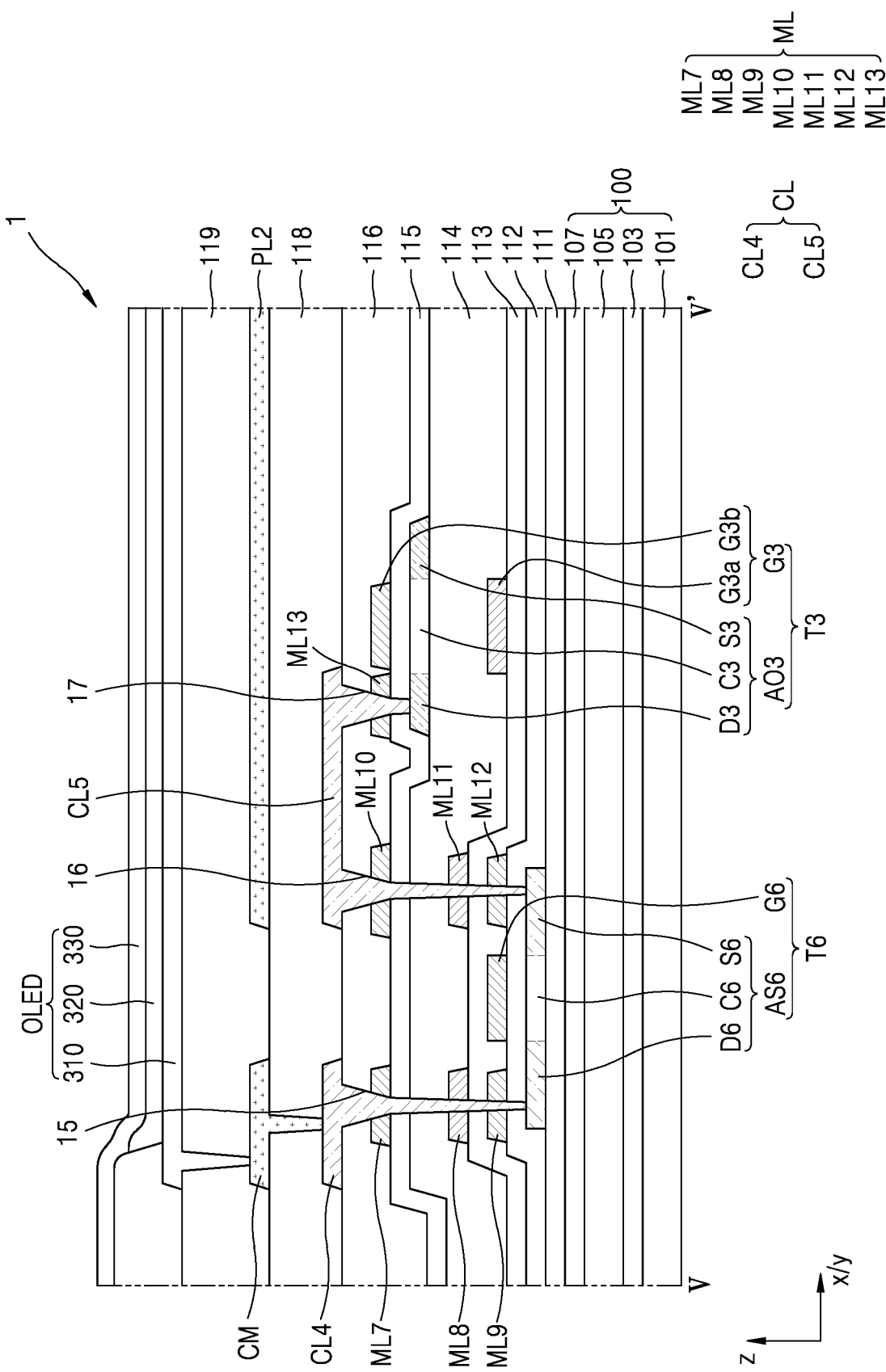
FIG. 5 is a schematic cross-sectional view of a portion of a display apparatus taken along the line V-V' of FIG. 3.

FIG. 4 is a schematic cross-sectional view of a portion of a display apparatus taken along the line IV-IV' of FIG. 3, and FIG. 5 is a schematic cross-sectional view of a portion of a display apparatus taken along the line V-V' of FIG. 3.

Hereinafter, a structure of the display apparatus, according to an embodiment, will be described in more detail according to a stacking order with reference to FIGS. 4 and 5.

FIGS. 4 and 5 illustrate cross-sections of portions of the display apparatus corresponding to the first transistor T1, the second transistor T2, the third transistor T3, the fourth transistor T4, the sixth transistor T6, the first capacitor Cst, the second capacitor Cbt, and the organic light-emitting diode OLED, which are illustrated in FIG. 3, and some elements thereof may not be shown in FIGS. 4 and 5.

A substrate 100 may include a glass material, a ceramic material, a metal material, or a polymer resin. In an embodiment, the substrate 100 may include a polymer resin, for example, such as polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). When the substrate 100 includes the polymer resin, the substrate 100 may be flexible and/or bendable.

The substrate 100 may have a single-layer structure or a multilayered structure including one or more of the above-described materials. In the case of the multilayered structure, the substrate 100 may further include an inorganic layer. For example, the substrate 100 may include a first organic base layer 101, a first inorganic barrier layer 103, a second organic base layer 105, and a second inorganic barrier layer 107. The first organic base layer 101 and the second organic base layer 105 may each include a polymer resin. Each of the first inorganic barrier layer 103 and the second inorganic barrier layer 107 may be a barrier layer for preventing or reducing the penetration of external foreign substances, and may include a single layer or multiple layers including an inorganic material, for example, such as silicon nitride ($SiN_x$) or silicon oxide ($SiO_x$).

A buffer layer 111 may be arranged on the substrate 100. The buffer layer 111 may increase the smoothness of the upper surface of the substrate 100, and may include an oxide layer, for example, such as silicon oxide ($SiO_x$), and/or a nitride layer, for example, such as silicon nitride ($SiN_x$), or silicon oxynitride ($SiO_xN_y$).

The semiconductor layers of the first transistor T1, the second transistor T2, the fifth transistor T5, the sixth transistor T6, and the seventh transistor T7 (e.g., see FIG. 3) may be arranged on the buffer layer 111.

A first semiconductor layer AS1 of the first transistor T1 may include the first channel region C1, the first source region S1, and the first drain region D1 (e.g., see FIG. 3). A second semiconductor layer AS2 of the second transistor T2 may include the second channel region C2, the second source region S2, and the second drain region D2. A fifth semiconductor layer of the fifth transistor T5 may include the fifth channel region C5, the fifth source region S5, and the fifth drain region D5 (e.g., see FIG. 3). A sixth semiconductor layer AS6 of the sixth transistor T6 may include the sixth channel region C6, the sixth source region S6, and the sixth drain region D6. A seventh semiconductor layer of the seventh transistor T7 may include the seventh channel region C7, the seventh source region S7, and the seventh drain region D7 (e.g., see FIG. 3).

In an embodiment, the first transistor T1, the second transistor T2, the fifth transistor T5, the sixth transistor T6, and the seventh transistor T7 are silicon-based transistors, and may each include a silicon semiconductor. In other words, the semiconductor layers of the first transistor T1, the second transistor T2, the fifth transistor T5, the sixth transistor T6, and the seventh transistor T7 are silicon semiconductor layers, and may be arranged at (e.g., in or on) the same layer as each other, and may be connected to each other.

A first gate insulating layer 112 may be located on the semiconductor layers of the first transistor T1, the second transistor T2, the fifth transistor T5, the sixth transistor T6, and the seventh transistor T7. The first gate insulating layer 112 may include an inorganic material including an oxide or a nitride. For example, the first gate insulating layer 112 may include at least one selected from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide (ZnO).

The first gate electrode G1 of the first transistor T1, the second gate electrode G2 of the second transistor T2, the fifth gate electrode G5 of the fifth transistor T5, the sixth gate electrode G6 of the sixth transistor T6, and the seventh gate electrode G7 of the seventh transistor T7 (e.g., see FIG. 3) may be arranged on the first gate insulating layer 112.

Also, the first scan line SL1 and the emission control line EL (e.g., see FIG. 3) may be arranged on the first gate insulating layer 112 to extend in the first direction (x-direction). A portion of the first scan line SL1 may be the third electrode CE3 of the second capacitor Cbt.

The first gate electrode G1 of the first transistor T1 may be provided in an isolated type. The second gate electrode G2 of the second transistor T2 may be a portion of the first scan line SL1 that crosses the second semiconductor layer AS2. The seventh gate electrode G7 of the seventh transistor T7 may be a portion of the first scan line SL1 that crosses the seventh semiconductor layer, or a portion of the second scan line SL2 (e.g., see FIG. 3) that is the first scan line SL1 of the next row. The fifth gate electrode G5 of the fifth transistor T5 may be a portion of the emission control line EL that crosses the fifth semiconductor layer, and the sixth gate electrode G6 of the sixth transistor T6 may be another portion of the emission control line EL that crosses the sixth semiconductor layer AS6.

The first gate electrode G1 of the first transistor T1 may function as the control electrode of the first transistor T1, as well as the first electrode CE1 of the first capacitor Cst.

The gate electrodes of the first transistor T1, the second transistor T2, the fifth transistor T5, the sixth transistor T6, and the seventh transistor T7 may include aluminum (Al), platinum (Pt), palladium (Pd), silver (Ag), magnesium (Mg), gold (Au), nickel (Ni), neodymium (Nd), iridium (Ir), chromium (Cr), Lithium (Li), calcium (Ca), molybdenum (Mo), titanium (Ti), tungsten (W), and/or copper (Cu), and may include a single layer or multiple layers including at least one of the above-described materials.

A second gate insulating layer 113 may be arranged on the gate electrodes of the first transistor T1, the second transistor T2, the fifth transistor T5, the sixth transistor T6, and the seventh transistor T7. The second gate insulating layer 113 may include an inorganic material including an oxide or a nitride. For example, the second gate insulating layer 113 may include at least one selected from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide (ZnO).

The second electrode CE2 may be arranged on the second gate insulating layer 113 to overlap with the first electrode CE1. The second electrode CE2 may include an opening. The opening may be defined by removing a portion of the second electrode CE2, and may have a closed shape.

The second gate insulating layer 113 may serve as a dielectric layer of the first capacitor Cst.

The second electrode CE2 of the first capacitor Cst may include a single layer or multiple layers including at least one selected from among Al, Pt, Pd, Ag, Mg, Au, Ni, Nd, Ir, Cr, Li, Ca, Mo, Ti, W, and/or Cu.

The first initialization voltage line VIL1, the lower scan line 143 of the third scan line SL3, and the lower scan line 145 of the fourth scan line SL4 (e.g., see FIG. 3) may be arranged on the second gate insulating layer 113, and may include the same material as that of the second electrode CE2 of the first capacitor Cst. A portion of the lower scan line 143 of the third scan line SL3 overlapping with a fourth semiconductor layer AO4 may be a lower gate electrode G4a of the fourth transistor T4. A portion of the lower scan line 145 of the fourth scan line SL4 overlapping with a third semiconductor layer AO3 may be a lower gate electrode G3a of the third transistor T3.

The first interlayer insulating layer 114 may be arranged on the second electrode CE2 of the first capacitor Cst. The first interlayer insulating layer 114 may include an inorganic material including an oxide or a nitride. For example, the first interlayer insulating layer 114 may include at least one selected from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide (ZnO).

The third semiconductor layer AO3 of the third transistor T3 and the fourth semiconductor layer AO4 of the fourth transistor T4 may be arranged on the first interlayer insulating layer 114. In an embodiment, the third transistor T3 and the fourth transistor T4 are oxide-based transistors, and may each include an oxide semiconductor. In other words, the third semiconductor layer AO3 and the fourth semiconductor layer AO4 are oxide semiconductor layers, and may be arranged at (e.g., in or on) the same layer as each other.

The oxide semiconductor layer may include a Zn oxide-based material, for example, such as Zn oxide, In—Zn oxide, Ga—In—Zn oxide, and/or the like. In some embodiments, the oxide semiconductor layer may include an In—Ga—Zn—O (IGZO) semiconductor, an In—Sn—Zn—O (ITZO) semiconductor, or an In—Ga—Sn—Zn—O (IGTZO) semiconductor, in which a metal, for example, such as indium (In), gallium (Ga), or tin (Sn), is included in ZnO.

The third semiconductor layer AO3 of the third transistor T3 may include the third channel region C3, the third source region S3, and the third drain region D3. The fourth semiconductor layer AO4 of the fourth transistor T4 may include the fourth channel region C4, the fourth source region S4, and the fourth drain region D4. The source regions and the drain regions of the third transistor T3 and the fourth transistor T4 may be formed by adjusting the carrier concentration of the oxide semiconductor to make them conductive. For example, the source regions and the drain regions of the third transistor T3 and the fourth transistor T4 may be formed by increasing the carrier concentration through plasma treatment using hydrogen (H)-based gas, fluorine (F)-based gas, or a combination thereof on the oxide semiconductor.

The oxide semiconductor layer may include the fourth electrode CE4 of the second capacitor Cbt. The fourth electrode CE4 of the second capacitor Cbt may be between the third semiconductor layer AO3 of the third transistor T3 and the fourth semiconductor layer AO4 of the fourth transistor T4. The fourth electrode CE4 may be provided to extend from the third semiconductor layer AO3 or from the fourth semiconductor layer AO4. In other words, the fourth electrode CE4 may be provided as an oxide semiconductor, and may be arranged on the first interlayer insulating layer 114. The second gate insulating layer 113 and the first interlayer insulating layer 114 may be between the third electrode CE3 and the fourth electrode CE4 of the second capacitor Cbt, and the second gate insulating layer 113 and the first interlayer insulating layer 114 may each function as a dielectric layer of the second capacitor Cbt.

A third gate insulating layer 115 may be arranged on the oxide semiconductor layer. The third gate insulating layer 115 may include an inorganic material including an oxide or a nitride. For example, the third gate insulating layer 115 may include at least one selected from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide (ZnO).

The second initialization voltage line VIL2, the upper scan line 163 of the third scan line SL3, and the upper scan line 165 of the fourth scan line SL4 (e.g., see FIG. 3) may be arranged on the third gate insulating layer 115 to extend in the first direction (x-direction). In some embodiments, the third scan line SL3 and the fourth scan line SL4 may be provided as two conductive lines arranged at (e.g., in or on) different layers from each other.

The upper scan line 163 of the third scan line SL3 may be arranged to at least partially overlap with the lower scan line 143 of the third scan line SL3. The upper scan line 165 of the fourth scan line SL4 may be arranged to at least partially overlap with the lower scan line 145 of the fourth scan line SL4.

In an embodiment, as illustrated in FIGS. 4 and 5, the third gate insulating layer 115 may be formed to cover both the third semiconductor layer AO3 and the fourth semiconductor layer AO4. In another embodiment, the third gate insulating layer 115 may be formed to be patterned in a shape corresponding to the upper scan line 163 of the third scan line SL3 and the upper scan line 165 of the fourth scan line SL4.

A portion of the upper scan line 163 of the third scan line SL3 overlapping with the fourth semiconductor layer AO4 may be an upper gate electrode G4b of the fourth transistor T4. A portion of the upper scan line 165 of the fourth scan line SL4 overlapping with the third semiconductor layer AO3 may be an upper gate electrode G3b of the third transistor T3. In other words, the third transistor T3 and the fourth transistor T4 may have a double gate structure in which control electrodes are provided above and below the respective semiconductor layer. The upper gate electrode G3b of the third transistor T3 and the upper gate electrode G4b of the fourth transistor T4 may be arranged on the third gate insulating layer 115, and may include a single layer or multiple layers including at least one of Mo, Cu, and/or Ti.

A second interlayer insulating layer 116 may be arranged to cover the third transistor T3 and the fourth transistor T4. The second interlayer insulating layer 116 may be arranged on the upper gate electrode G3b of the third transistor T3 and the upper gate electrode G4b of the fourth transistor T4. A conductive layer CL may be arranged on the second interlayer insulating layer 116. The conductive layer CL may include the first to fifth conductive layers CL1, CL2, CL3, CL4, and CL5.

The second interlayer insulating layer 116 may include an inorganic material including an oxide or a nitride. For example, the second interlayer insulating layer 116 may include at least one selected from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide (ZnO).

The conductive layer CL may include a material having a high conductivity, for example, such as a metal or a conductive oxide. For example, each of the first to fifth conductive layers CL1, CL2, CL3, CL4, and CL5 may include a single layer or multiple layers including at least one of Al, Cu, and/or Ti. In some embodiments, the first to fifth conductive layers CL1, CL2, CL3, CL4, and CL5 may have a three-layered structure including Ti, Al, and Ti that are sequentially arranged (e.g., Ti/Al/Ti).

The conductive layer CL may be connected to at least one of a silicon semiconductor layer, a gate electrode, an electrode of a capacitor, and/or an oxide semiconductor layer arranged therebelow through a contact hole.

The first conductive layer CL1 may be electrically connected to a silicon semiconductor layer, for example, such as the second semiconductor layer AS2 of the second transistor T2, through the first contact hole 11. The first contact hole 11 may expose the second semiconductor layer AS2 through (e.g., by penetrating) the first gate insulating layer 112, the second gate insulating layer 113, the first interlayer insulating layer 114, the third gate insulating layer 115, and the second interlayer insulating layer 116.

The second conductive layer CL2 may be electrically connected to the second electrode CE2 of the first capacitor Cst through the second contact hole 12 formed in (e.g., penetrating) the first interlayer insulating layer 114, the third gate insulating layer 115, and the second interlayer insulating layer 116.

One end of the third conductive layer CL3 may be electrically connected to the oxide semiconductor layer, for example, such as the fourth electrode CE4 of the second capacitor Cbt, the fourth semiconductor layer AO4 of the fourth transistor T4, or the third semiconductor layer AO3 of the third transistor T3, through the third contact hole 13. The third contact hole 13 may expose the fourth semiconductor layer AO4 through (e.g., by penetrating) the third gate insulating layer 115 and the second interlayer insulating layer 116.

The other end of the third conductive layer CL3 may be electrically connected to the first gate electrode G1 through the fourth contact hole 14. The fourth contact hole 14 may penetrate through the second gate insulating layer 113, the first interlayer insulating layer 114, the third gate insulating layer 115, and the second interlayer insulating layer 116 to expose the first gate electrode G1.

The fourth contact hole 14 may be arranged in (e.g., to extend through) an opening of the second electrode CE2 to be spaced apart from an edge of the opening, and a portion of the third conductive layer CL3 located in the fourth contact hole 14 may be electrically connected to the second electrode CE2.

The fourth electrode CE4 of the second capacitor Cbt may be connected to the third conductive layer CL3, and may be electrically connected to the first gate electrode G1. Accordingly, when the first scan signal Sn supplied to the first scan line SL1 is turned off (e.g., has a turn-off level), the second capacitor Cbt may increase the voltage of the node N2 (e.g., see FIG. 2), so that the black gradation is clearly expressed.

The fourth conductive layer CL4 may be electrically connected to the silicon semiconductor layer, for example, such as the sixth drain region D6 of the sixth semiconductor layer AS6 of the sixth transistor T6, through the fifth contact hole 15. The fifth contact hole 15 may expose the silicon semiconductor layer through (e.g., by penetrating) the first gate insulating layer 112, the second gate insulating layer 113, the first interlayer insulating layer 114, the third gate insulating layer 115, and the second interlayer insulating layer 116.

One end of the fifth conductive layer CL5 may be electrically connected to the silicon semiconductor layer, for example, such as the sixth source region S6 of the sixth semiconductor layer AS6 of the sixth transistor T6, through the sixth contact hole 16. The sixth contact hole 16 may expose the silicon semiconductor layer through (e.g., by penetrating) the first gate insulating layer 112, the second gate insulating layer 113, the first interlayer insulating layer 114, the third gate insulating layer 115, and the second interlayer insulating layer 116.

The other end of the fifth conductive layer CL5 may be electrically connected to the oxide semiconductor layer, for example, such as the third semiconductor layer AO3 of the third transistor T3, through the seventh contact hole 17. The seventh contact hole 17 may expose the oxide semiconductor layer through (e.g., by penetrating) the third gate insulating layer 115 and the second interlayer insulating layer 116.

A first planarization layer 118 may be arranged on the first to fifth conductive layers CL1, CL2, CL3, CL4, and CL5. The data line DL, the second power supply voltage line PL2, and the connection electrode CM may be arranged on the first planarization layer 118.

The data line DL is connected to the first conductive layer CL1 through a contact hole formed in the first planarization layer 118, and thus, may be electrically connected to the second source region S2 of the second transistor T2. The second power supply voltage line PL2 may be connected to the first power supply voltage line PL1 through a contact hole formed in the first planarization layer 118.

The connection electrode CM is electrically connected to the fourth conductive layer CL4 through a contact hole formed in the first planarization layer 118, and thus, may be electrically connected to the sixth drain region D6 of the sixth transistor T6. The connection electrode CM may be electrically connected to the pixel electrode 310 through a contact hole formed in a second planarization layer 119 that is on the first planarization layer 118, thereby transmitting an electrical signal applied from the sixth transistor T6 to the pixel electrode 310.

The first planarization layer 118 and the second planarization layer 119 may include an organic material, for example, such as acryl, benzocyclobutene (BCB), polyimide, or hexamethyldisiloxane (HMDSO). As another example, each of the first planarization layer 118 and the second planarization layer 119 may include an inorganic material. The first planarization layer 118 and the second planarization layer 119 may serve as a protective layer covering the first to seventh transistors T1 to T7, and may be provided so that the upper surfaces of the first planarization layer 118 and the second planarization layer 119 are planarized or substantially planarized. Each of the first planarization layer 118 and the second planarization layer 119 may include a single layer or multiple layers.

A pixel-defining layer 120 may be arranged on the second planarization layer 119. The pixel-defining layer 120 may include an opening corresponding to each pixel, or in other words, an opening exposing a central portion of at least the pixel electrode 310, thereby defining a pixel. Also, the pixel-defining layer 120 may increase a distance between an edge of the pixel electrode 310 and an opposite electrode 330 over the pixel electrode 310, thereby preventing or reducing arcs and/or the like from occurring at the edge of the pixel electrode 310. The pixel-defining layer 120 may include, for example, an organic material such as polyimide or HMDSO.

An intermediate layer 320 of the organic light-emitting diode OLED may include a low molecular weight material or a polymer material. When the intermediate layer 320 includes the low molecular weight material, the intermediate layer 320 may have a single-layer structure or multilayered structure including a hole injection layer (HIL), a hole transport layer (HTL), an emission layer (EML), an electron transport layer (ETL), and an electron injection layer (EIL). The intermediate layer 320 may include various suitable organic materials, for example, such as copper phthalocyanine (CuPc), N,N'-di(naphthalene-1-yl)-N,N'-diphenyl-benzidine (NPB), and/or tris-8-hydroxyquinoline aluminum (Alq3). These layers may be formed by vacuum deposition.

When the intermediate layer 320 includes the polymer material, the intermediate layer 320 may have a structure including an HTL and an EML. In this case, the HTL may include poly-3,4-ethylene dioxy thiophene (PEDOT), and the EML may include a polymer material, for example, such as a polyphenylene vinylene (PPV)-based material, and/or a polyfluorene-based material. The intermediate layer 320 may be formed by screen printing, inkjet printing, or laser induced thermal image (LITI).

However, the intermediate layer 320 is not limited thereto. The intermediate layer 320 may have various suitable structures. Also, the intermediate layer 320 may include an integrated layer over the pixel electrodes 310, or may include one or more layers that are patterned to correspond to the pixel electrodes 310.

The opposite electrode 330 may be formed as one body with respect to a plurality of organic light-emitting diodes OLED, and may correspond to the pixel electrodes 310.

The organic light-emitting diodes OLED may be damaged (e.g., may be easily damaged) by external moisture and/or oxygen. Accordingly, an encapsulation layer or a sealing substrate may be further arranged on the organic light-emitting diodes OLED to cover the organic light-emitting diodes OLED, so as to protect the organic light-emitting diodes OLED. The encapsulation layer may cover the display area DA (e.g., see FIG. 1), and may extend to the outside of the display area DA. The encapsulation layer may include at least one inorganic layer and at least one organic layer. In some embodiments, the encapsulation layer may have a structure in which a first inorganic layer, an organic layer, and a second inorganic layer are stacked on one another. The sealing substrate may be arranged to face the substrate 100, and may be bonded to the substrate 100 at (e.g., in or on) the peripheral area PA (e.g., see FIG. 1) by a sealing member, for example, such as a sealant or a frit.

Also, in some embodiments, a spacer may be further provided on the pixel-defining layer 120, so as to prevent or substantially prevent a mask dent, and various suitable functional layers, for example, such as a polarizing layer for reducing external light reflection, a black matrix, a color filter, and/or a touch screen layer including a touch electrode, may be further provided on the encapsulation layer.

According to an embodiment, at least one metal layer ML may be between the silicon semiconductor layer and the conductive layer CL. As another example, at least one metal layer ML may be between the gate electrode and the conductive layer CL. As another example, at least one metal layer ML may be between the oxide semiconductor layer and the conductive layer CL.

In an embodiment, a first metal layer ML1, a second metal layer ML2, and/or a third metal layer ML3 may be between the second semiconductor layer AS2 of the second transistor T2 and the first conductive layer CL1.

The first metal layer ML1 may be arranged on the third gate insulating layer 115, for example, such as at (e.g., in or on) the same layer as those of the upper gate electrode G4b of the fourth transistor T4 and the upper gate electrode G3b of the third transistor T3. The first metal layer ML1 may include the same material as those of the upper gate electrode G4b of the fourth transistor T4 and the upper gate electrode G3b of the third transistor T3.

The second metal layer ML2 may be arranged on the second gate insulating layer 113, for example, such as at (e.g., in or on) the same layer as those of the second electrode CE2 of the first capacitor Cst, the lower gate electrode G4a of the fourth transistor T4, and the lower gate electrode G3a of the third transistor T3. The second metal layer ML2 may include the same material as those of the second electrode CE2, the lower gate electrode G4a of the fourth transistor T4, and the lower gate electrode G3a of the third transistor T3.

The third metal layer ML3 may be arranged on the first gate insulating layer 112, for example, such as at (e.g., in or on) the same layer as those of the gate electrodes of the first transistor T1, the second transistor T2, the fifth transistor T5, the sixth transistor T6, and the seventh transistor T7, and the third electrode CE3 of the second capacitor Cbt. The third metal layer ML3 may include the same material as those of the gate electrodes of the first transistor T1, the second transistor T2, the fifth transistor T5, the sixth transistor T6, and the seventh transistor T7.

A fourth metal layer ML4 may be between the second electrode CE2 of the first capacitor Cst and the second conductive layer CL2. A fifth metal layer ML5 may be between the fourth semiconductor layer AO4 of the fourth transistor T4 and the third conductive layer CL3. A sixth metal layer ML6 may be between the first gate electrode G1 of the first transistor T1 and the third conductive layer CL3. A seventh metal layer ML7, an eighth metal layer ML8, and/or a ninth metal layer ML9 may be between the sixth semiconductor layer AS6 of the sixth transistor T6 and the fourth conductive layer CL4. A tenth metal layer ML10, an eleventh metal layer ML11, and/or a twelfth metal layer ML12 may be between the sixth semiconductor layer AS6 of the sixth transistor T6 and the fifth conductive layer CLS. A thirteenth metal layer ML13 may be between the third semiconductor layer AO3 of the third transistor T3 and the fifth conductive layer CLS.

The fourth to seventh metal layers ML4, ML5, ML6, and ML7, the tenth metal layer ML10, and the thirteenth metal layer ML13 may be arranged at (e.g., in or on) the same layer as that of the first metal layer ML1, and may include the same material as that of the first metal layer ML1. The eighth metal layer ML8 and the eleventh metal layer ML11 may be arranged at (e.g., in or on) the same layer as that of the second metal layer ML2, and may include the same material as that of the second metal layer ML2. The ninth metal layer ML9 and the twelfth metal layer ML12 may be arranged at (e.g., in or on) the same layer as that of the third metal layer ML3, and may include the same material as that of the third metal layer ML3. FIGS. 4 and 5 illustrate that all of the first to thirteenth metal layers ML1, ML2, ML3, ML4, ML5, ML6, ML7, ML8, ML9, ML10, ML11, ML12, and ML13 are provided. However, the present disclosure is not limited thereto, and some of the first to thirteenth metal layers ML1, ML2, ML3, ML4, ML5, ML6, ML7, ML8, ML9, ML10, ML11, ML12, and ML13 may be omitted as needed or desired.

The metal layer ML may be electrically insulated from other conductive layers, electrodes, and semiconductor layers. In other words, the metal layer ML may be electrically floated. Therefore, the metal layer ML may not have an electrical influence on two electrodes that are connected to each other through a contact hole.

Figure 6A:
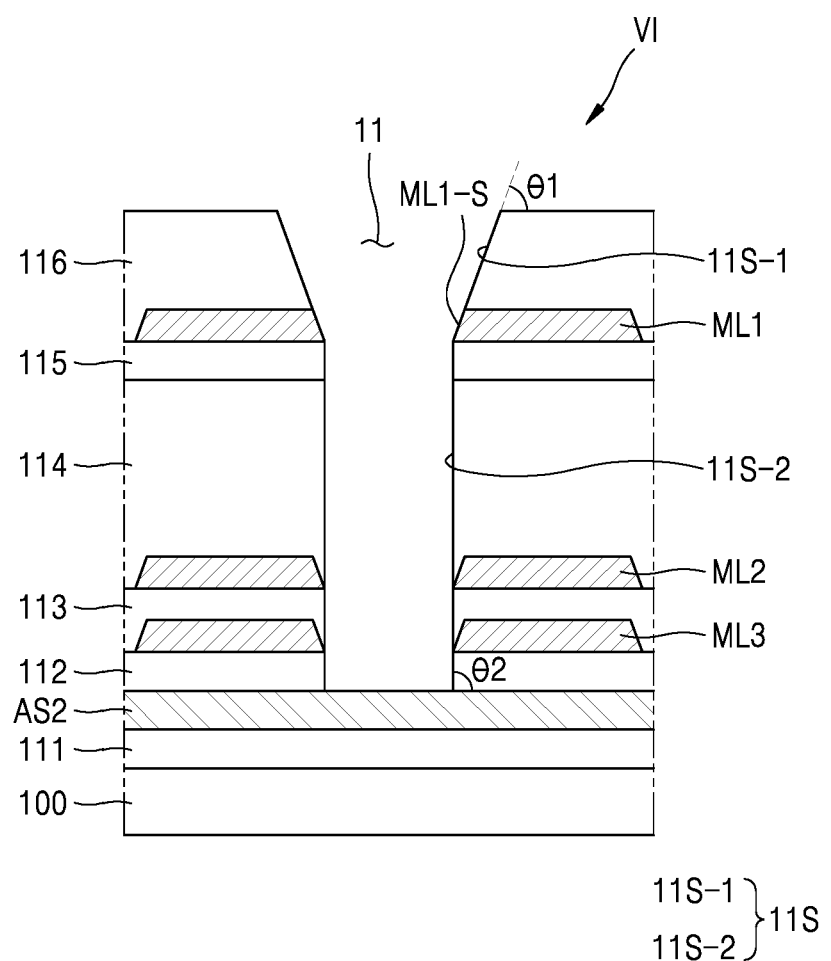
FIGS. 6A-6B are schematic cross-sectional views of a portion of a display apparatus being manufactured, according to an embodiment.
Figure 6B:
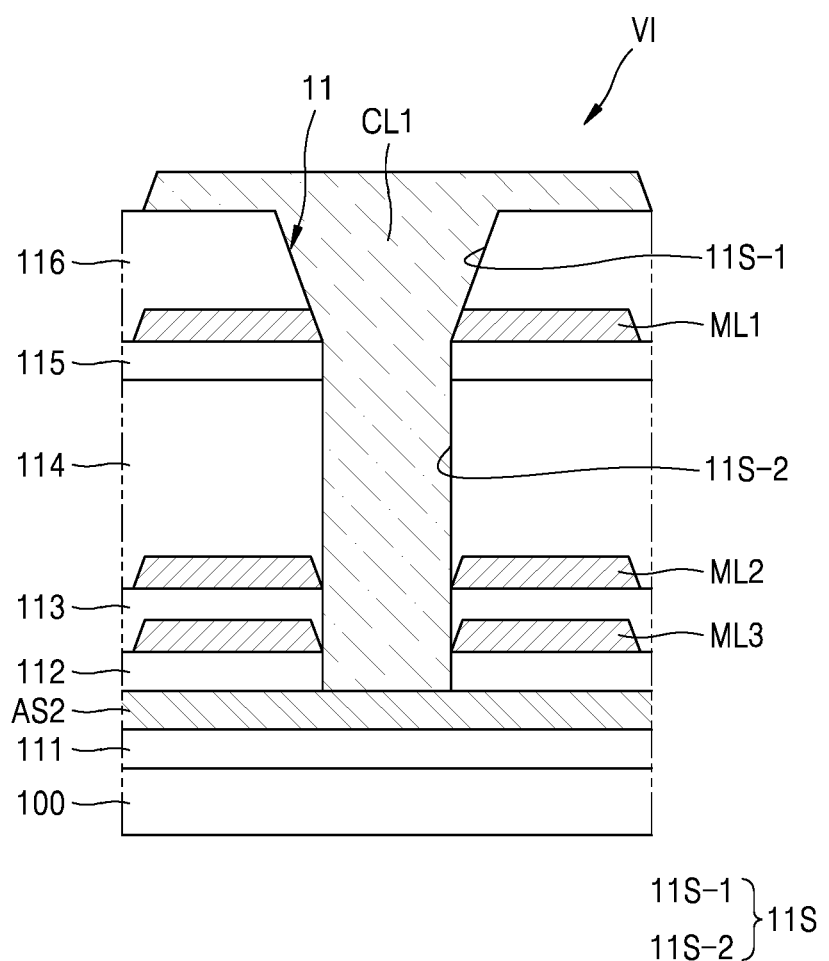

FIGS. 6A and 6B are schematic cross-sectional views of a portion of a display apparatus being manufactured, according to an embodiment, and illustrate an enlarged view of the region VI of the display apparatus of FIG. 4. FIG. 6A illustrates a state after (e.g., immediately after) the first contact hole 11 is formed, and FIG. 6B illustrates a state after the first conductive layer CL1 is formed. In FIGS. 6A and 6B, the same reference symbols are used to denote the same or substantially the same (e.g., or corresponding) elements and layers from among the elements and layers described above with reference to FIGS. 3 to 5, and thus, redundant description thereof may not be repeated.

Referring to FIG. 6A, the first contact hole 11 may be formed in the first gate insulating layer 112, the second gate insulating layer 113, the first interlayer insulating layer 114, the third gate insulating layer 115, and the second interlayer insulating layer 116. The first to third metal layers ML1, ML2, and ML3 may be arranged to overlap with each other, and may be arranged around (e.g., to surround around periphery of) the first contact hole 11 on a plane (e.g., in a plan view or in a view from a direction that is perpendicular to or substantially perpendicular to a top surface of the relevant element or layer). In this case, the term "on a plane" may mean "on a virtual plane that is parallel to or substantially parallel to one surface (e.g., a relevant surface such as a top surface) of the substrate 100".

In an embodiment, an inner surface 11S of the first contact hole 11 may include a side surface of at least one of the first to third metal layers ML1, ML2, and ML3. In this case, the "side surface of the metal layer" does not necessarily mean an outer surface, and when the metal layer includes an opening on a plane, an inner surface thereof may also be included. For example, the inner surface 11S of the first contact hole 11 may include a side surface ML1-S of the first metal layer ML1.

Also, the inner surface 11S of the first contact hole 11 may include a first portion 11S-1 located on the first metal layer ML1, and a second portion 11S-2 located below the first metal layer ML1. According to an embodiment, the first portion 11S-1 of the inner surface 11S may be tapered. For example, with respect to one surface of the substrate 100, a first angle θ1 of the first portion 11S-1 of the inner surface 11S may be different from a second angle θ2 of the second portion 11S-2 of the inner surface 11S. In other words, the first angle θ1 between the first portion 11S-1 of the inner surface 11S and a virtual plane that is parallel to or substantially parallel to the one surface of the substrate 100 may be different from the second angle θ2 between the second portion 11S-2 of the inner surface 11S and a virtual plane that is parallel to or substantially parallel to the one surface of the substrate 100. For example, the first angle θ1 may be less than the second angle θ2.

FIG. 6A illustrates that the second portion 11S-2 of the inner surface 11S of the first contact hole 11 is not tapered, and is perpendicular to or substantially perpendicular to one surface of the substrate 100, but the present disclosure is not limited thereto. From example, in some embodiments, the second portion 11S-2 may also be tapered. However, even in this case, the first angle θ1 and the second angle θ2 may be different from each other. For example, the first angle θ1 may be less than the second angle θ2. The structures of the first angle θ1 and the second angle θ2 will be described in more detail below with reference to FIGS. 15A and 15B.

As an example, side surfaces of the second metal layer ML2 and the third metal layer ML3 arranged below the first metal layer ML1 may also be included in the inner surface 11S of the first contact hole 11. As another example, the side surfaces of the second metal layer ML2 and/or the third metal layer ML3 may not be included in the inner surface 11S of the first contact hole 11.

Referring to FIG. 6B, the first conductive layer CL1 may be formed over the third gate insulating layer 115, and a portion of the first conductive layer CL1 may be formed in (e.g., may be inserted into) the first contact hole 11. In other words, the portion of the first conductive layer CL1 may be located in the first contact hole 11.

Accordingly, the first conductive layer CL1 may be connected to the second semiconductor layer AS2 that is exposed by the first contact hole 11.

As described above, the inner surface 11S of the first contact hole 11 may include a side surface of at least one of the first to third metal layers ML1, ML2, and ML3, and thus, the first conductive layer CL1 may be in contact with the side surface of at least one of the first to third metal layers ML1, ML2, and ML3 in the first contact hole 11. For example, because the inner surface 11S of the first contact hole 11 includes the side surface ML1-S of the first metal layer ML1, the first conductive layer CL1 may be in contact with the side surface ML1-S of the first metal layer ML1. The first metal layer ML1 may be electrically floated, and thus, may not have an electrical influence on the first conductive layer CL1 and the second semiconductor layer AS2.

A manufacturing process of the display apparatus 1 involves a patterning process using a photolithography process. In more detail, a photoresist is applied on a material layer on which a pattern is to be formed, and then exposed and developed to form a photoresist having a desired pattern. Then, a desired pattern is formed by wet-etching or dry-etching the material layer using the photoresist as an etching mask. Through such a process, a number of thin-film transistors, storage capacitors, signal lines, and conductive layers included in the display apparatus 1 may be formed. As the demand for a display apparatus having a reduced size and a high resolution increases, it may be desirable to integrate the elements of the display apparatus. In this case, a finer pattern may be desired.

In order to implement a finer pattern, the width of a pattern of a photoresist functioning as an etching mask may be reduced. When the ratio of the thickness to the width of the pattern is greater than a predetermined or certain level, the pattern of the photoresist may collapse. Thus, a hard mask may be formed below the photoresist, and a lower layer may be etched through the hard mask. However, when the hard mask is used, additional processes, for example, such as deposition and removal of the hard mask, may be used or needed, and thus, manufacturing costs may be increased, manufacturing time may be increased, and/or the like.

Also, for integration, the number of layers constituting (e.g., included in) the display apparatus may increase, and patterns of the layers may overlap with each other. As another example, a new layer may be added to add various suitable additional functions and/or effects. In this case, because the number of stacked insulating layers increases, the total thickness of insulating layers to be etched using a photo mask to form a contact hole may increase. Accordingly, the etching time increases, which may result in the width of the contact hole undesirably increasing. Thus, a hard mask may be formed below a photo mask, or an etching gas containing a large amount of carbon (C) may be used. However, when the etching gas containing the large amount of carbon, for example, such as an etching gas containing $CH_2F_2$, $C_4F_8$, $C_2HF_5$, and/or the like, is used, contamination of a chamber in which an etching process is performed may occur.

According to an embodiment of the present disclosure, when forming a contact hole in the insulating layers through a photolithography process during the manufacturing process of the display apparatus 1, the metal layer ML may function as a hard mask. In other words, a contact hole having a finer size may be precisely formed even without using a separate hard mask. Therefore, additional processes, for example, such as deposition and removal of the hard mask, may not be used or may be unnecessary, and the manufacturing costs and/or the manufacturing time may be improved. Furthermore, an etching gas containing a large amount of carbon may not be used or may be unnecessary, and thus, contamination of the chamber may be reduced or minimized.

In addition, according to an embodiment, because an inner surface of the contact hole includes a side surface of the metal layer, a micro-trench phenomenon or a notch phenomenon may be improved, thereby preventing or reducing damage to a semiconductor layer and/or the like. The micro-trench phenomenon is a phenomenon in which, when an etching process is performed using a high-density plasma device, plasma ions are incident downward along an etching surface, and abnormally etch a bottom surface (e.g., the upper surface of a semiconductor layer or a gate electrode). The notch phenomenon is a phenomenon in which an etching surface is abnormally etched in a lateral direction from the lower portion thereof. In more detail, as the etching process for forming the contact hole is performed, the side surface of the metal layer is exposed, and scattering and bounding phenomena of plasma ions (cations) on the etching surface may be minimized or reduced by free electrons included in the metal layer. Accordingly, the micro-trench phenomenon or the notch phenomenon may be improved.

According to an embodiment, the size of the contact hole may be precisely controlled and minimized or reduced even without using a hard mask. The number of contact holes in a circuit pattern forming the elements, for example, such as the thin-film transistors or the like, may be considerable. By minimizing or reducing the size of the contact hole, a degree of freedom in designing the circuit pattern may be enhanced. Also, the elements of the display apparatus may be highly integrated, and thus, a high-resolution display apparatus may be implemented.

Figure 7A:
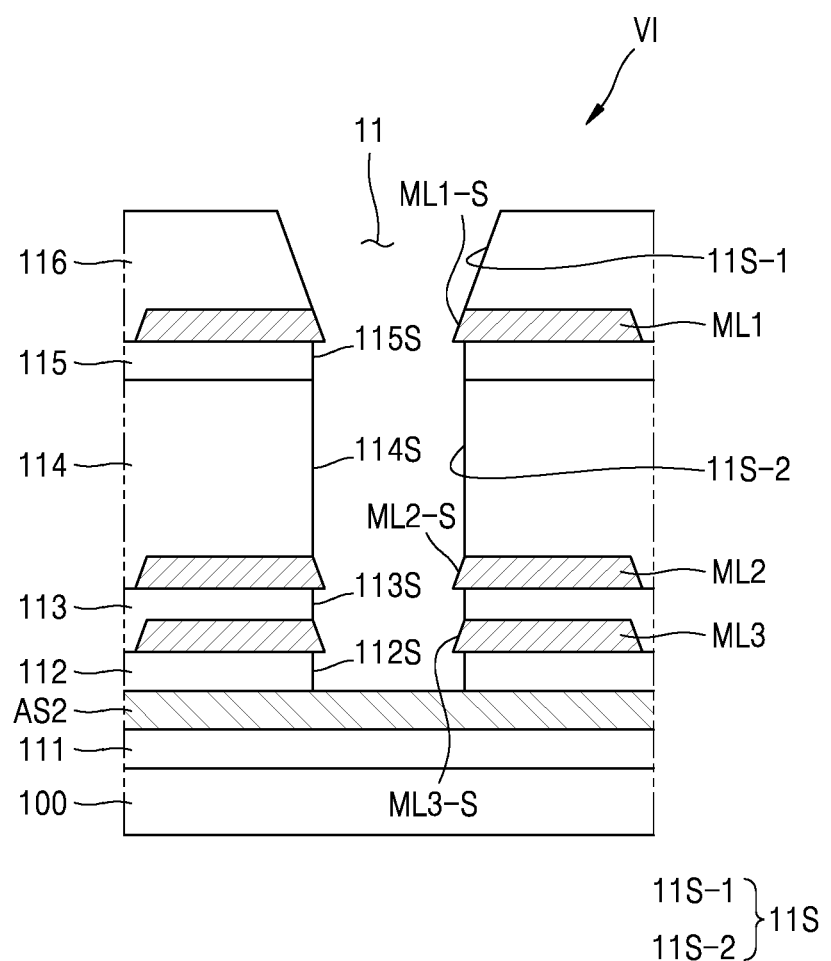
FIGS. 7A-7B are schematic cross-sectional views of a portion of a display apparatus being manufactured, according to another embodiment.
Figure 7B:
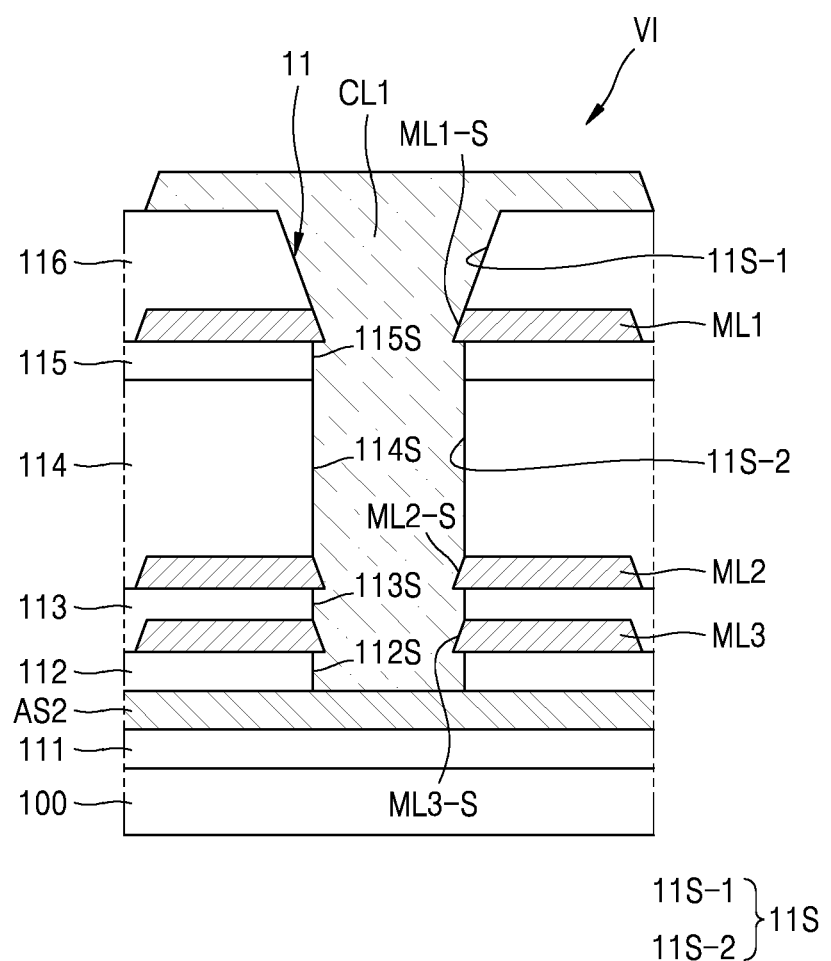

FIGS. 7A and 7B are schematic cross-sectional views of a portion of a display apparatus being manufactured, according to another embodiment, and may correspond to an enlarged view of the region VI of the display apparatus of FIG. 4. Hereinafter, the differences between the embodiments of FIGS. 7A and 7B from the embodiments of FIGS. 6A and 6B may be mainly described, and redundant description therebetween may not be repeated.

Referring to FIG. 7A, the inner surface 11S of the first contact hole 11 may not only include the side surface ML1-S of the first metal layer ML1, but may further include a side surface ML2-S of the second metal layer ML2, and a side surface ML3-S of the third metal layer ML3, which are arranged below the first metal layer ML1. As another example, the first contact hole 11 may further include only one of the side surface ML2-S of the second metal layer ML2 or the side surface ML3-S of the third metal layer ML3.

In an embodiment, at least one of side surfaces 112S, 113S, 114S, and 115S of the first gate insulating layer 112, the second gate insulating layer 113, the first interlayer insulating layer 114, and the third gate insulating layer 115 may be farther away from the center of the first contact hole 11 than that of the side surface ML1-S of the first metal layer ML1. The structure of the first contact hole 11 may be formed when a mixed gas of $SF_6$ and $O_2$, a mixed gas of $CF_4$ and $O_2$, or a mixed gas of $NF_3$ and $O_2$ is used as an etching gas.

Referring to FIG. 7B, the inner surface 11S of the first contact hole 11 includes the side surfaces ML1-S, ML2-S, and ML3-S of the first to third metal layers ML1, ML2, and ML3, and thus, the first conductive layer CL1 may be in contact with the side surfaces ML1-S, ML2-S, and ML3-S of the first to third metal layers ML1, ML2, and ML3 in the first contact hole 11. The first to third metal layers ML1, ML2, and ML3 may be electrically floated, and thus, may not have an electrical influence on the first conductive layer CL1 and the second semiconductor layer AS2.

Figure 8A:
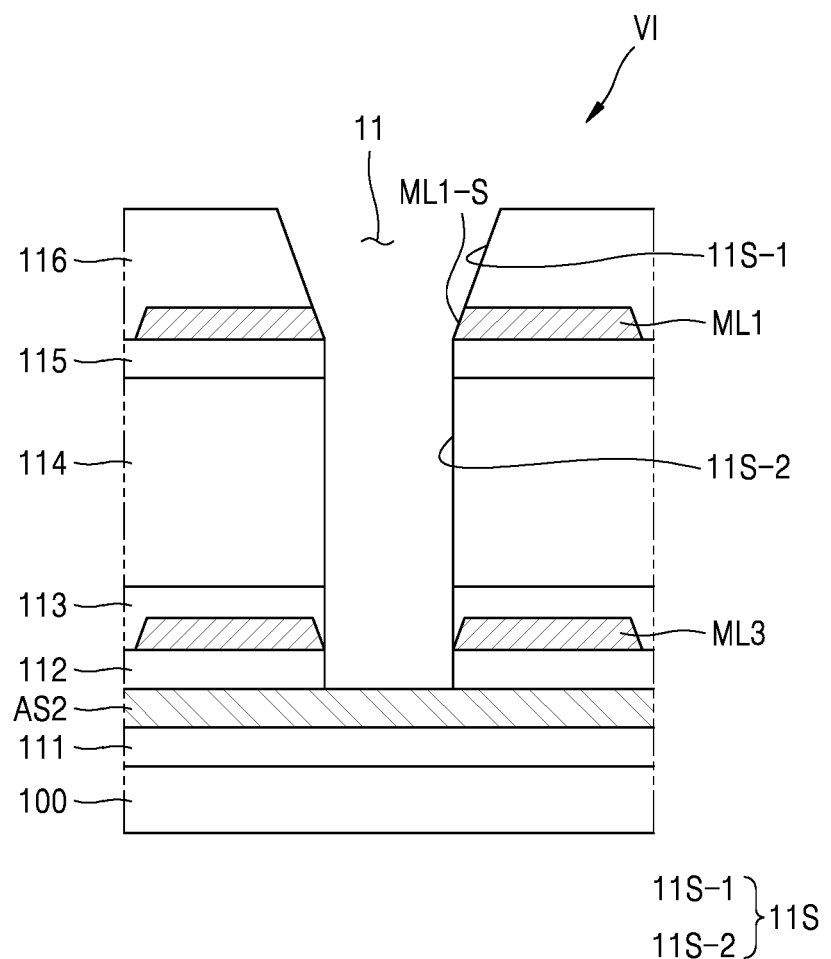
FIGS. 8A-8B are schematic cross-sectional views of a portion of a display apparatus being manufactured, according to another embodiment.
Figure 8B:
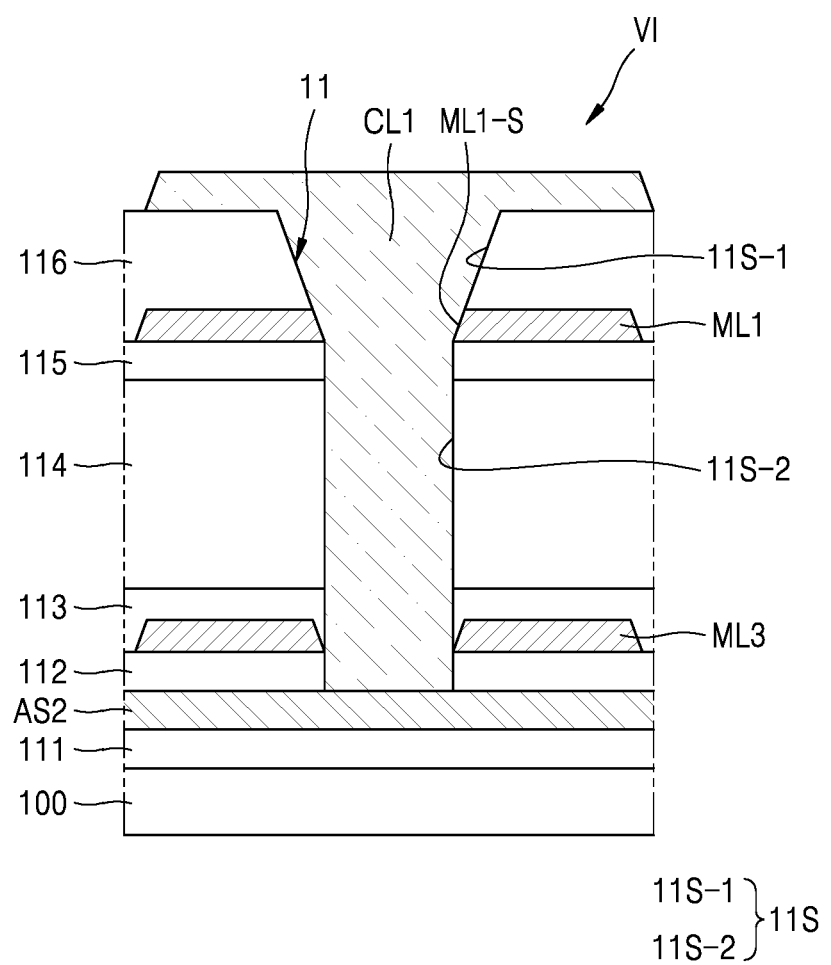

FIGS. 8A and 8B are schematic cross-sectional views of a portion of a display apparatus being manufactured, according to another embodiment, and may correspond to an enlarged view of the region VI of the display apparatus of FIG. 4. Hereinafter, the differences between the embodiments of FIGS. 8A and 8B from the embodiments of FIGS. 6A and 6B may be mainly described, and redundant description therebetween may not be repeated.

Referring to FIGS. 8A and 8B, the first metal layer ML1 and the third metal layer ML3 may be arranged to overlap with each other, or may be arranged around (e.g., to surround around a periphery of) the first contact hole 11 on a plane (e.g., in a plan view). The second metal layer ML2 may be omitted. The inner surface 11S of the first contact hole 11 may include the side surface ML1-S of the first metal layer ML1, and the first conductive layer CL1 may be in contact with the side surface ML1-S of the first metal layer ML1 in the first contact hole 11.

Figure 9A:
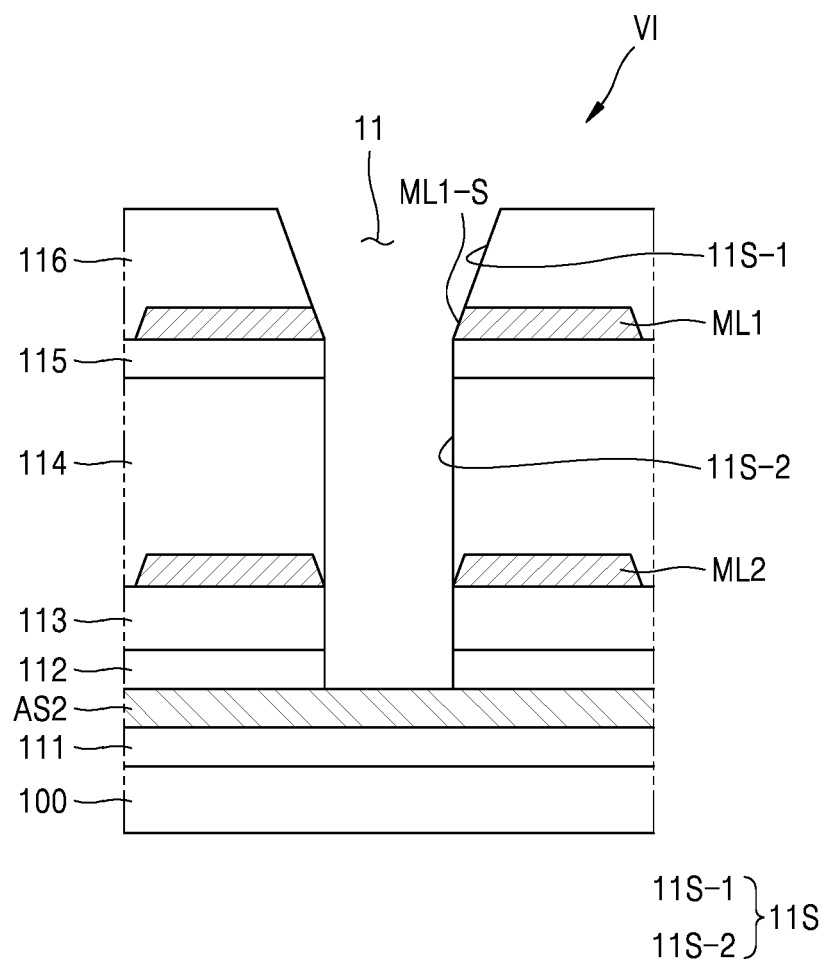
FIGS. 9A-9B are schematic cross-sectional views of a portion of a display apparatus being manufactured, according to another embodiment.
Figure 9B:
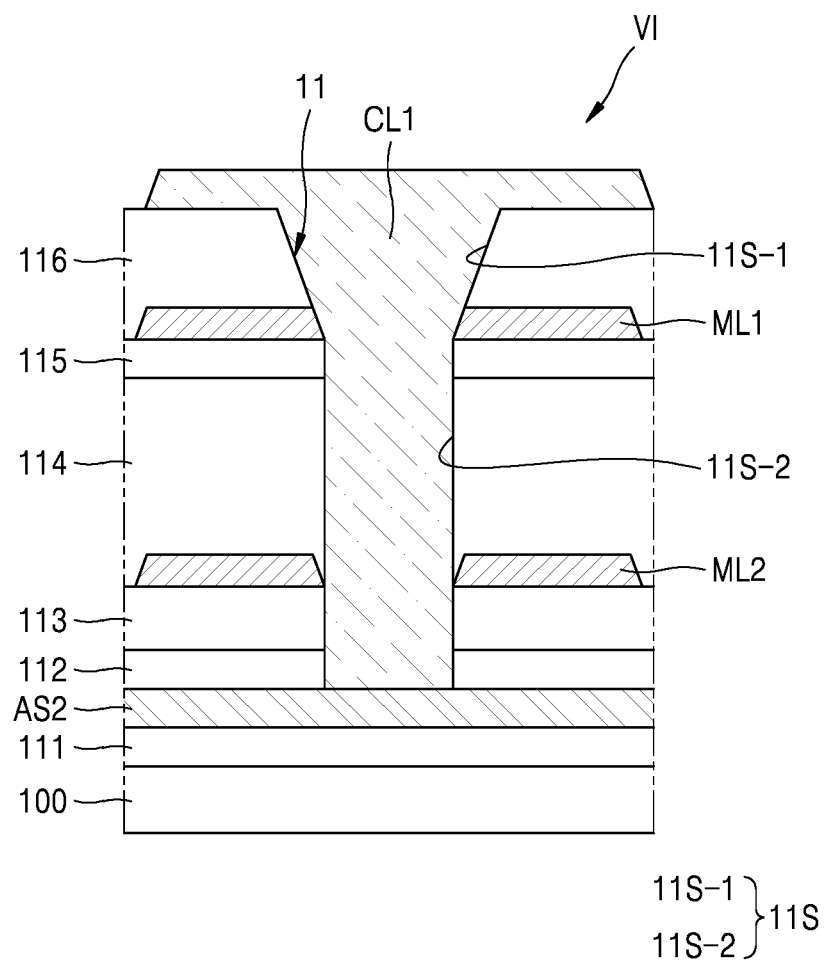

FIGS. 9A and 9B are schematic cross-sectional views of a portion of a display apparatus being manufactured, according to another embodiment, and may correspond to an enlarged view of the region VI of the display apparatus of FIG. 4. Hereinafter, the differences between the embodiments of FIGS. 9A and 9B from the embodiments of FIGS. 6A and 6B may be mainly described, and redundant description therebetween may not be repeated.

Referring to FIGS. 9A and 9B, the first metal layer ML1 and the second metal layer ML2 may be arranged to overlap with each other, or may be arranged around (e.g., to surround around a periphery of) the first contact hole 11 on a plane (e.g., in a plan view). The third metal layer ML3 may be omitted. The inner surface 11S of the first contact hole 11 may include the side surface ML1-S of the first metal layer ML1, and the first conductive layer CL1 may be in contact with the side surface ML1-S of the first metal layer ML1 in the first contact hole 11.

The first metal layer ML1 may be used as a hard mask. As the first metal layer ML1 from among the first to third metal layers ML1 to ML3 is arranged at the top on a cross-section (e.g., in a cross-sectional view), and is closest to the first conductive layer CL1, the first metal layer ML1 may be used as the hard mask. In this case, the term "on a cross-section" may refer to "on a virtual plane perpendicular to or substantially perpendicular to one surface of the substrate 100". Further, there may be relatively fewer restrictions on the location of the first metal layer ML1, because the area occupied by the second initialization voltage line VIL2, the third scan line SL3, and the fourth scan line SL4 arranged at (e.g., in or on) the same layer as that of the first metal layer ML1 is relatively small.

Figure 10A:
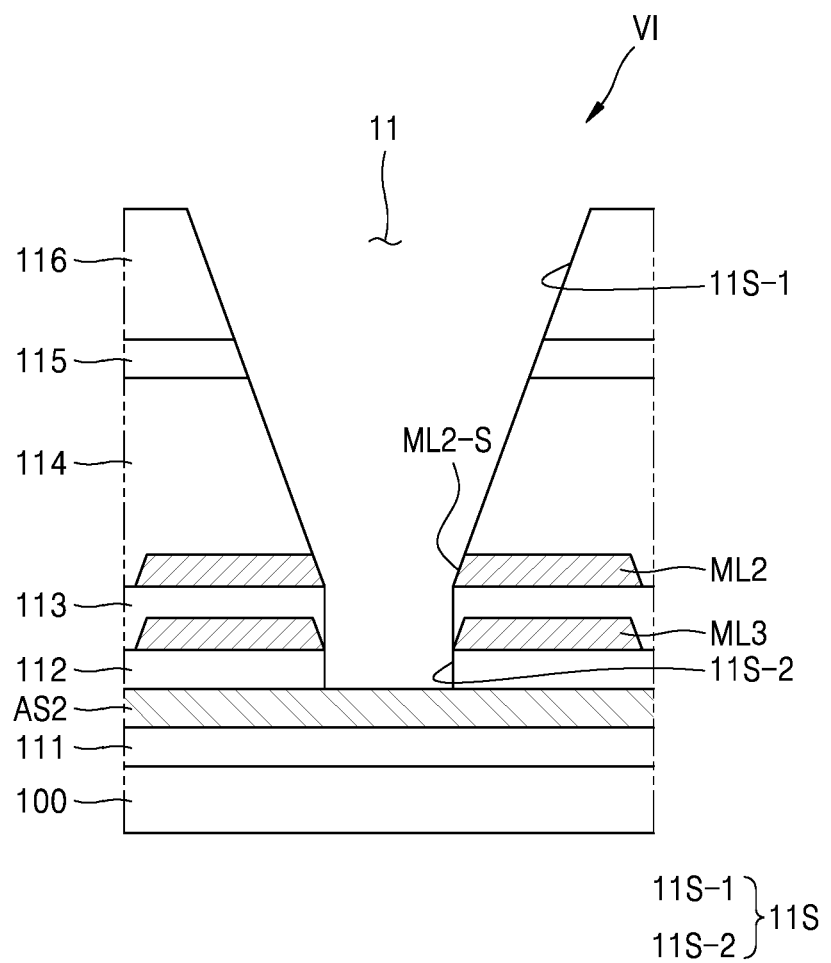
FIGS. 10A-10B are schematic cross-sectional views of a portion of a display apparatus being manufactured, according to another embodiment.
Figure 10B:
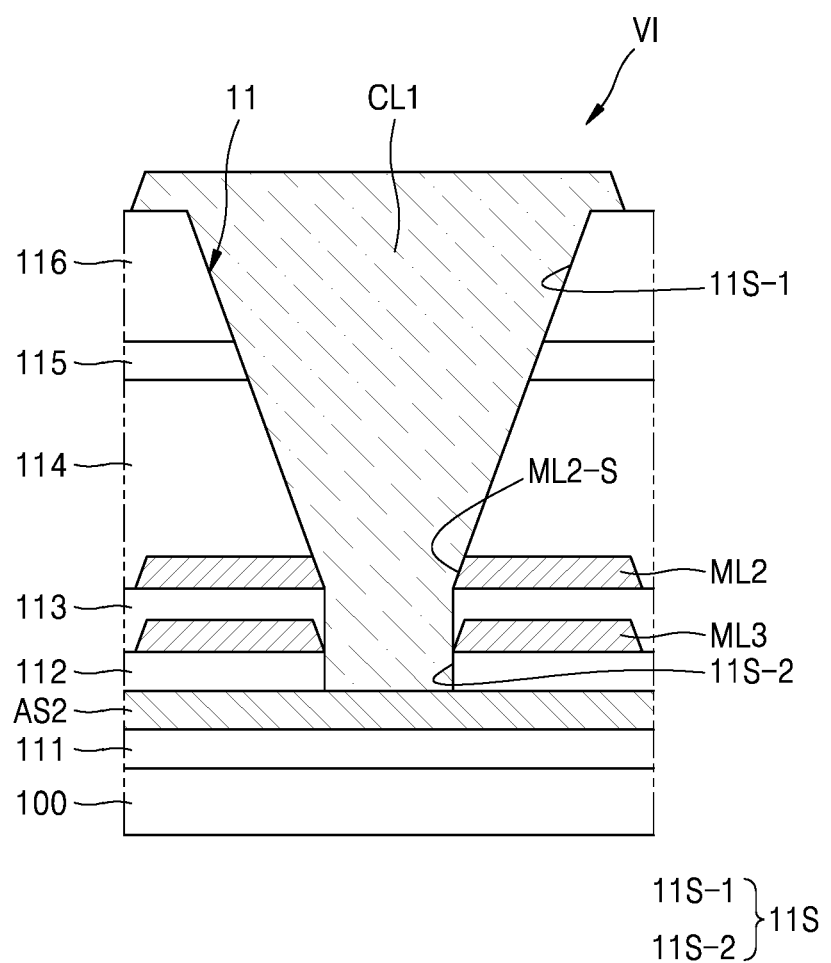

FIGS. 10A and 10B are schematic cross-sectional views of a portion of a display apparatus being manufactured, according to another embodiment, and may correspond to an enlarged view of the region VI of the display apparatus of FIG. 4. Hereinafter, the differences between the embodiments of FIGS. 10A and 10B from the embodiments of FIGS. 6A and 6B may be mainly described, and redundant description therebetween may not be repeated.

Referring to FIGS. 10A and 10B, around the first contact hole 11, the arrangement of the first metal layer ML1 may be omitted, and the second metal layer ML2 and the third metal layer ML3 may be arranged. In this case, the inner surface 11S of the first contact hole 11 may include at least the side surface ML2-S of the second metal layer ML2. The first portion 11S-1 of the inner surface 11S of the first contact hole 11 located over the second metal layer ML2 may be tapered.

The first conductive layer CL1 may be arranged on the third gate insulating layer 115, and a portion of the first conductive layer CL1 may be located inside the first contact hole 11. The first conductive layer CL1 may be in contact with at least the side surface ML2-S of the second metal layer ML2 in the first contact hole 11.

Figure 11A:
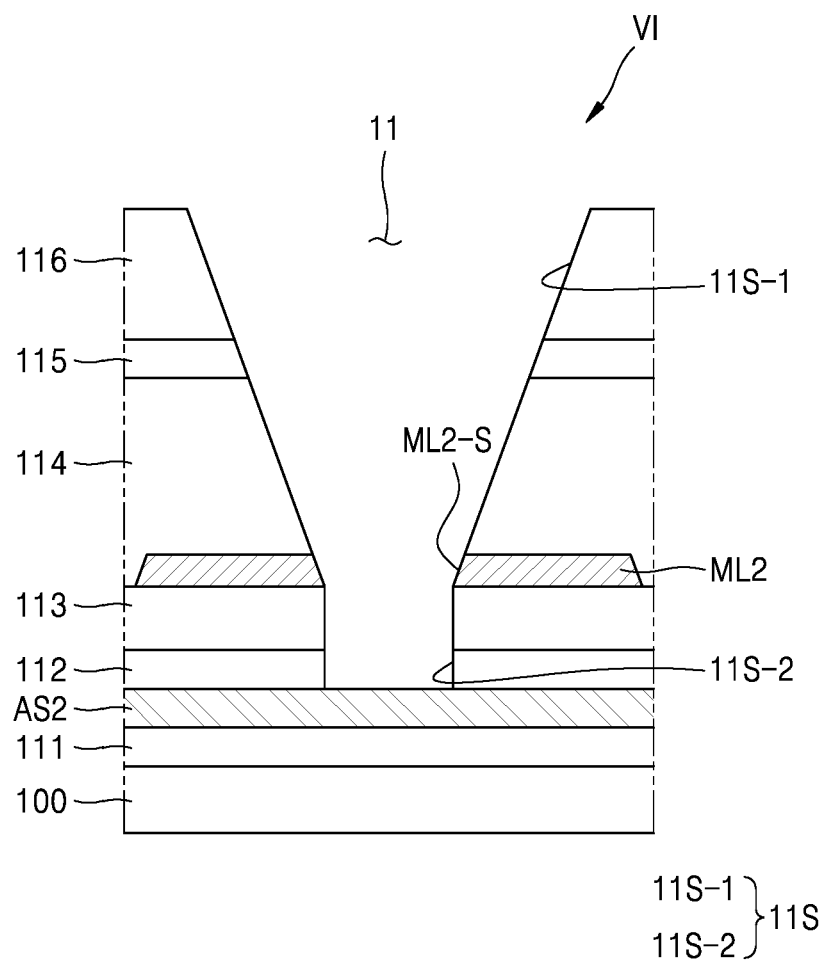
FIGS. 11A-11B are schematic cross-sectional views of a portion of a display apparatus being manufactured, according to another embodiment.
Figure 11B:
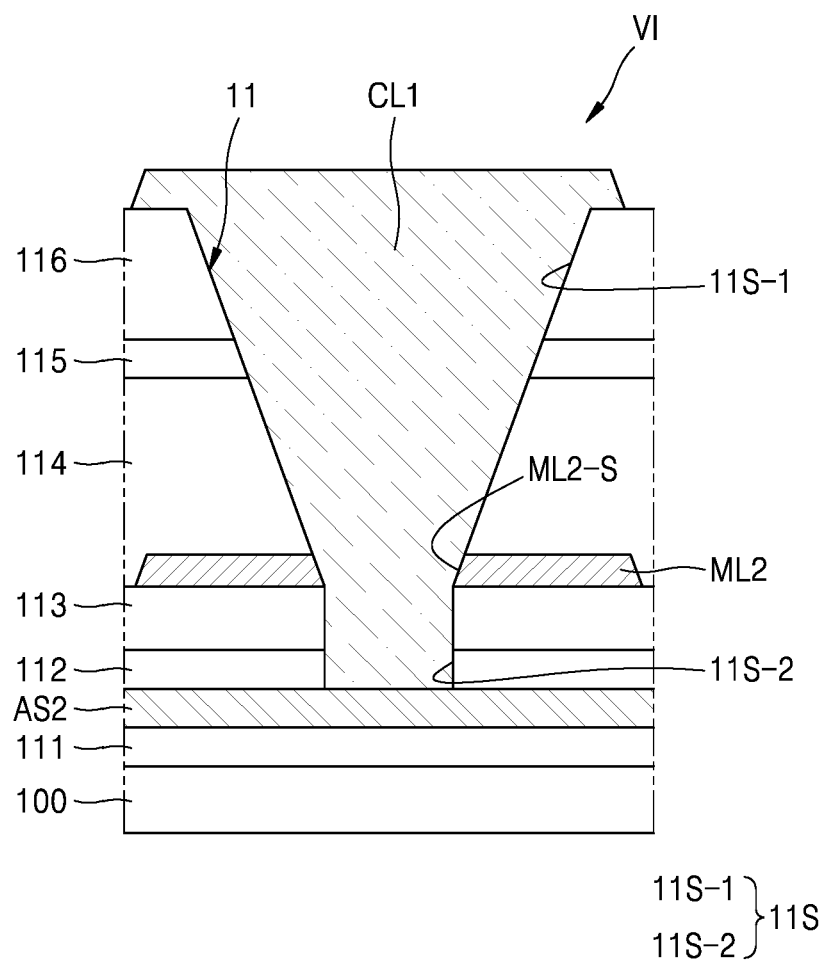

FIGS. 11A and 11B are schematic cross-sectional views of a portion of a display apparatus being manufactured, according to another embodiment, and may correspond to an enlarged view of the region VI of the display apparatus of FIG. 4. Hereinafter, the differences between the embodiments of FIGS. 11A and 11B from the embodiments of FIGS. 6A and 6B may be mainly described, and redundant description therebetween may not be repeated.

Referring to FIGS. 11A and 11B, around the first contact hole 11, the arrangements of the first metal layer ML1 and the third metal layer ML3 may be omitted, and the second metal layer ML2 may be arranged. The inner surface 11S of the first contact hole 11 may include the side surface ML2-S of the second metal layer ML2.

The first conductive layer CL1 may be arranged on the third gate insulating layer 115, and a portion of the first conductive layer CL1 may be located inside the first contact hole 11. The first conductive layer CL1 may be in contact with the side surface ML2-S of the second metal layer ML2 in the first contact hole 11.

Figure 12A:
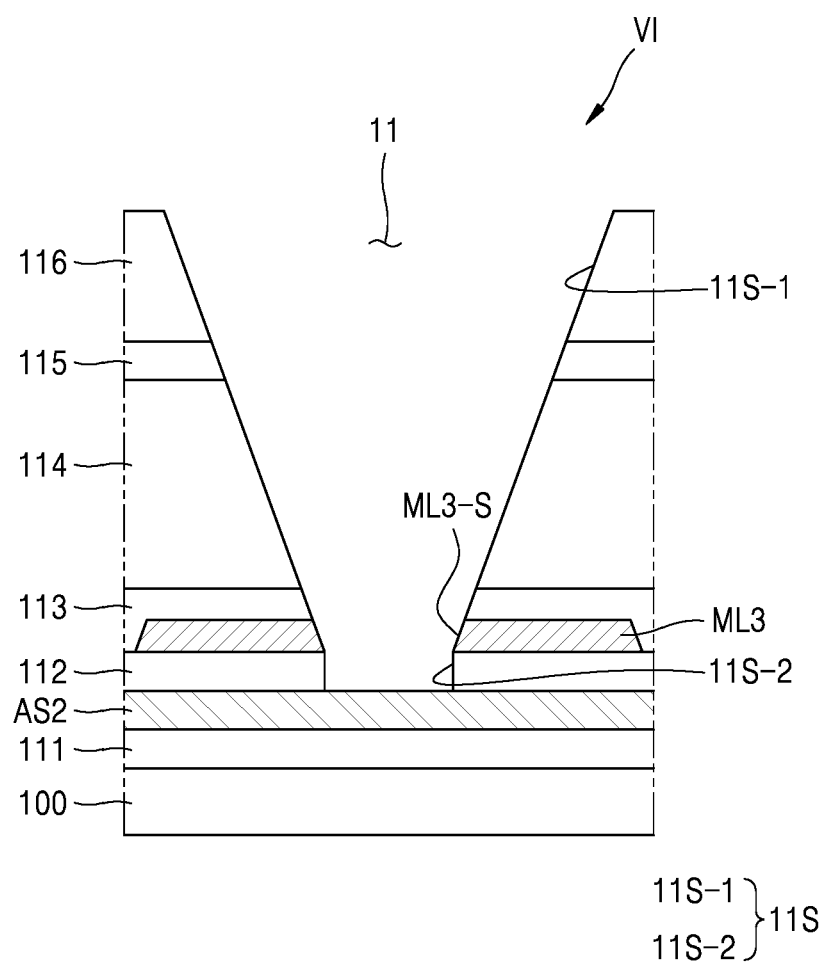
FIGS. 12A-12B are schematic cross-sectional views of a portion of a display apparatus being manufactured, according to another embodiment.
Figure 12B:
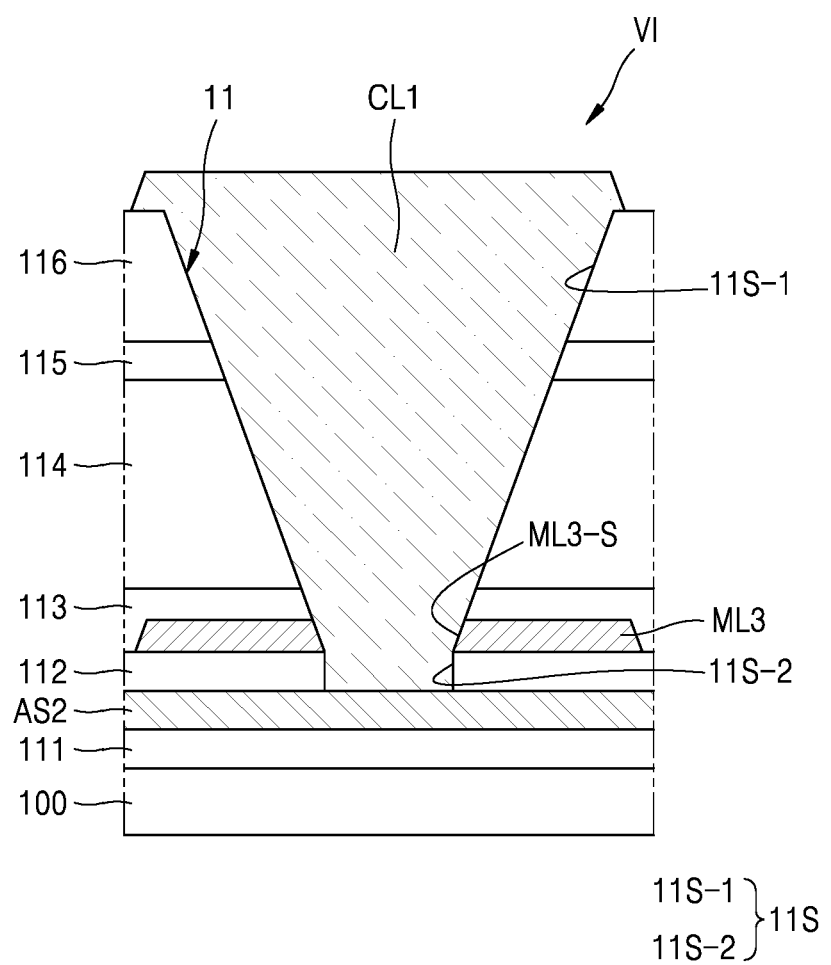

FIGS. 12A and 12B are schematic cross-sectional views of a portion of a display apparatus being manufactured, according to another embodiment, and may correspond to an enlarged view of the region VI of the display apparatus of FIG. 4. Hereinafter, the differences between the embodiments of FIGS. 12A and 12B from the embodiments of FIGS. 6A and 6B may be mainly described, and redundant description therebetween may not be repeated.

Referring to FIGS. 12A and 12B, around the first contact hole 11, the arrangements of the first metal layer ML1 and the second metal layer ML2 may be omitted, and the third metal layer ML3 may be arranged. In this case, the inner surface 11S of the first contact hole 11 may include the side surface ML3-S of the third metal layer ML3. The first portion 11S-1 of the inner surface 11S of the first contact hole 11 located over the third metal layer ML3 may be tapered.

The first conductive layer CL1 may be arranged on the third gate insulating layer 115, and a portion of the first conductive layer CL1 may be located inside the first contact hole 11. The first conductive layer CL1 may be in contact with at least the side surface ML3-S of the third metal layer ML3 in the first contact hole 11.

Figure 13A:
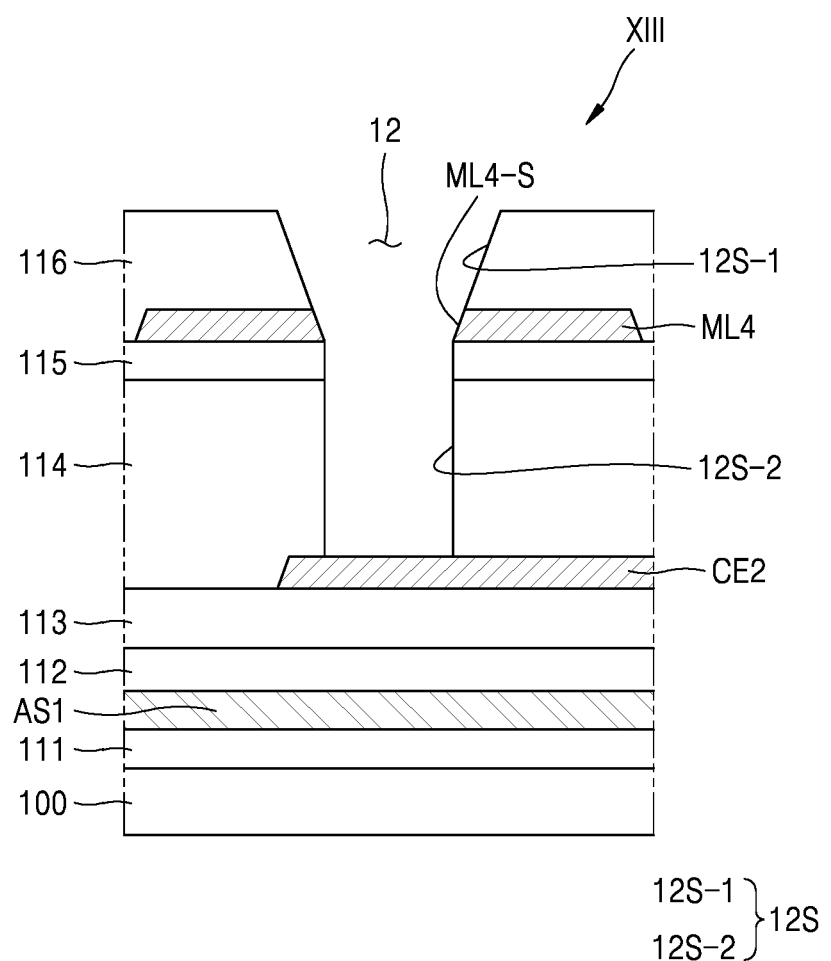
FIGS. 13A-13B are schematic cross-sectional views of a portion of a display apparatus being manufactured, according to an embodiment.
Figure 13B:
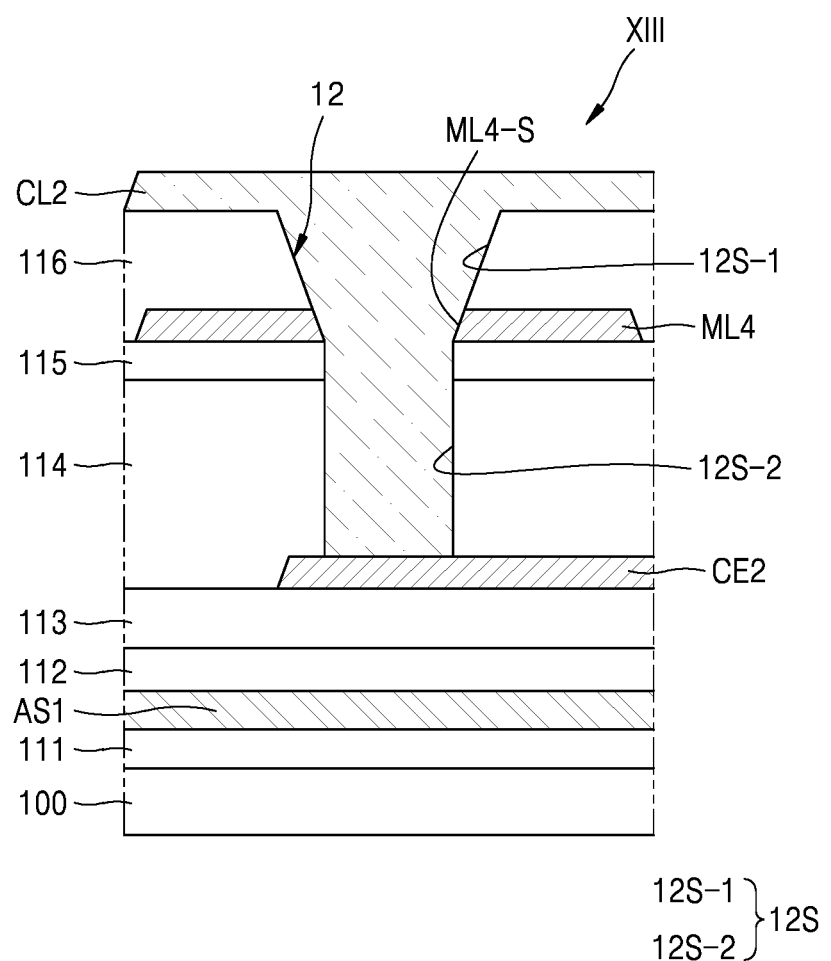

FIGS. 13A and 13B are schematic cross-sectional views of a portion of a display apparatus being manufactured, according to an embodiment, and illustrate an enlarged view of the region XIII of the display apparatus of FIG. 4. FIG. 13A illustrates a state after (e.g., immediately after) the second contact hole 12 is formed, and FIG. 13B illustrates a state after the second conductive layer CL2 is formed. In FIGS. 13A and 13B, the same reference symbols are used to denote the same or substantially the same (or corresponding) elements and layers from among the elements and layers described above with reference to FIGS. 3 to 5, and thus, redundant description thereof may not be repeated.

Referring to FIG. 13A, the second contact hole 12 may be formed in the first interlayer insulating layer 114, the third gate insulating layer 115, and the second interlayer insulating layer 116. The fourth metal layer ML4 may be arranged around (e.g., to surround around a periphery of) the second contact hole 12 on a plane (e.g., in a plan view).

In an embodiment, an inner surface 12S of the second contact hole 12 may include a side surface ML4-S of the fourth metal layer ML4. In other words, the side surface ML4-S of the fourth metal layer ML4 may define a portion of the inner surface 12S of the second contact hole 12. The inner surface 12S of the second contact hole 12 may include a first portion 12S-1 located on the fourth metal layer ML4, and a second portion 12S-2 located below the fourth metal layer ML4. According to an embodiment, the first portion 12S-1 of the inner surface 12S may be tapered. With respect to one surface of the substrate 100, a first angle θ1 of the first portion 12S-1 of the inner surface 12S may be different from a second angle θ2 of the second portion 12S-2 of the inner surface 12S.

Referring to FIG. 13B, the second conductive layer CL2 may be formed over the third gate insulating layer 115, and a portion of the second conductive layer CL2 may be formed in (e.g., may be inserted into) the second contact hole 12. In other words, the portion of the second conductive layer CL2 may be located in the second contact hole 12. Accordingly, the second conductive layer CL2 may be connected to the second electrode CE2 that is exposed by the second contact hole 12. As described above, the inner surface 12S of the second contact hole 12 includes the side surface ML4-S of the fourth metal layer ML4, and thus, the second conductive layer CL2 may be in contact with the side surface ML4-S of the fourth metal layer ML4.

Figure 14A:
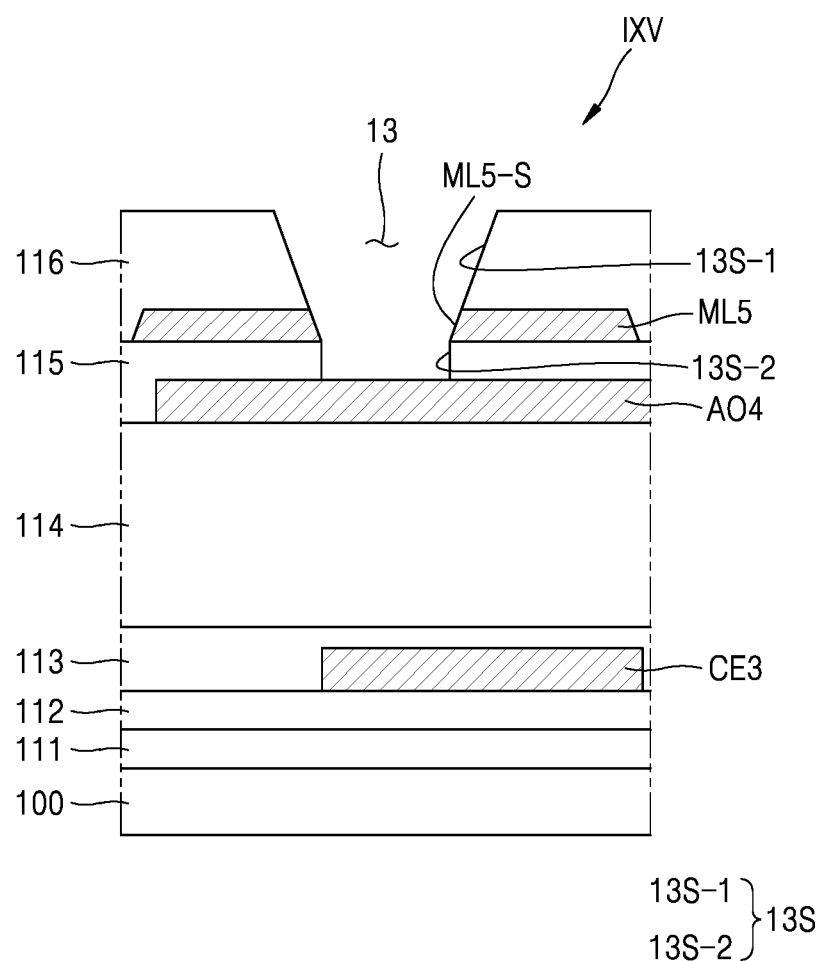
FIGS. 14A-14B are schematic cross-sectional views of a portion of a display apparatus being manufactured, according to an embodiment.
Figure 14B:
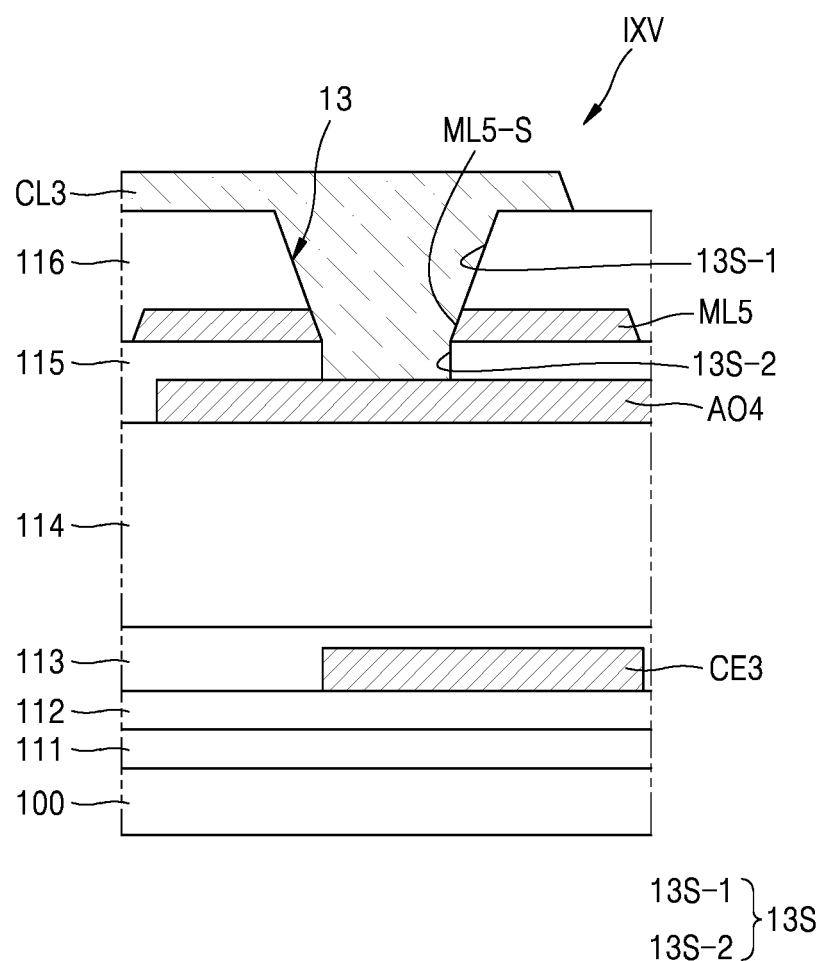

FIGS. 14A and 14B are schematic cross-sectional views of a portion of a display apparatus being manufactured, according to an embodiment, and illustrate an enlarged view of the region IXV of the display apparatus of FIG. 4. FIG. 14A illustrates a state after (e.g., immediately after) the third contact hole 13 is formed, and FIG. 14B illustrates a state after the third conductive layer CL3 is formed. In FIGS. 14A and 14B, the same reference symbols are used to denote the same or substantially the same (or corresponding) elements and layers from among the elements and layers described above with reference to FIGS. 3 to 5, and thus, redundant description thereof may not be repeated.

Referring to FIG. 14A, the third contact hole 13 may be formed in the third gate insulating layer 115 and the second interlayer insulating layer 116. The fifth metal layer ML5 may be arranged around (e.g., to surround around a periphery of) the third contact hole 13.

In an embodiment, an inner surface 13S of the third contact hole 13 may include a side surface ML5-S of the fifth metal layer ML5. In other words, the side surface ML5-S of the fifth metal layer ML5 may define a portion of the inner surface 13S of the third contact hole 13. The inner surface 13S of the third contact hole 13 may include a first portion 13S-1 located on the fifth metal layer ML5, and a second portion 13S-2 located below the fifth metal layer ML5. According to an embodiment, the first portion 13S-1 of the inner surface 13S may be tapered. With respect to one surface of the substrate 100, a first angle θ1 of the first portion 13S-1 of the inner surface 13S may be different from a second angle θ2 of the second portion 13S-2 of the inner surface 13S.

Referring to FIG. 14B, the third conductive layer CL3 may be formed over the third gate insulating layer 115, and a portion of the third conductive layer CL3 may be formed in (e.g., may be inserted into) the third contact hole 13. In other words, the portion of the third conductive layer CL3 may be located in the third contact hole 13. Accordingly, the third conductive layer CL3 may be connected to the fourth semiconductor layer AO4 that is exposed by the third contact hole 13. As described above, the inner surface 13S of the third contact hole 13 includes the side surface ML5-S of the fifth metal layer ML5, and thus, the third conductive layer CL3 may be in contact with the side surface ML5-S of the fifth metal layer ML5.

Figure 15A:
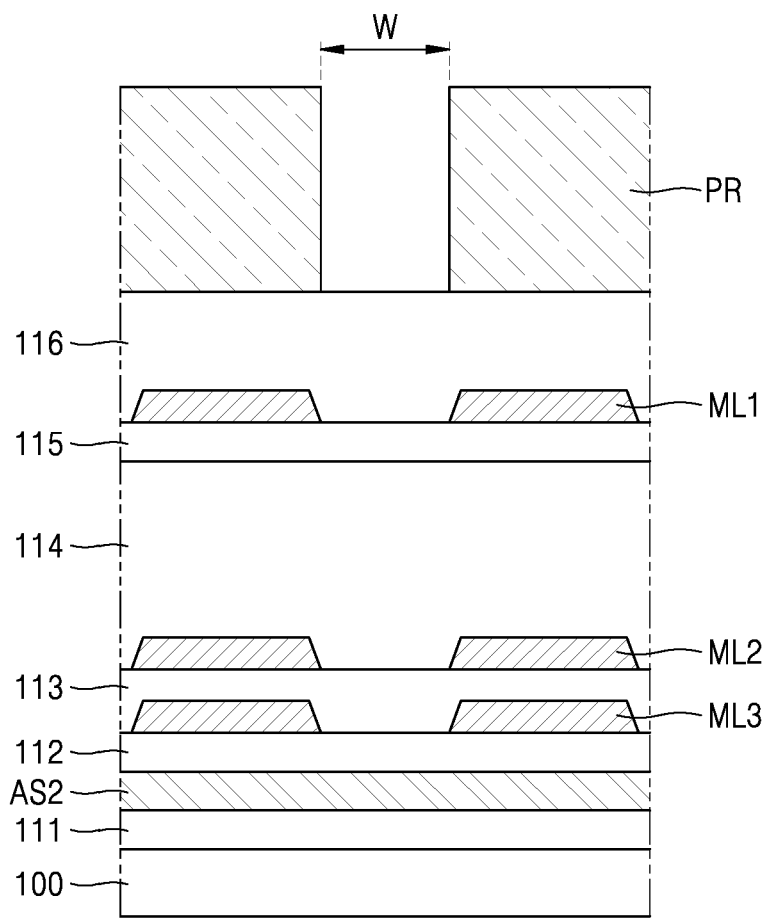
FIGS. 15A-15B are schematic cross-sectional views of some operations of a method of manufacturing a display apparatus, according to an embodiment.
Figure 15B:
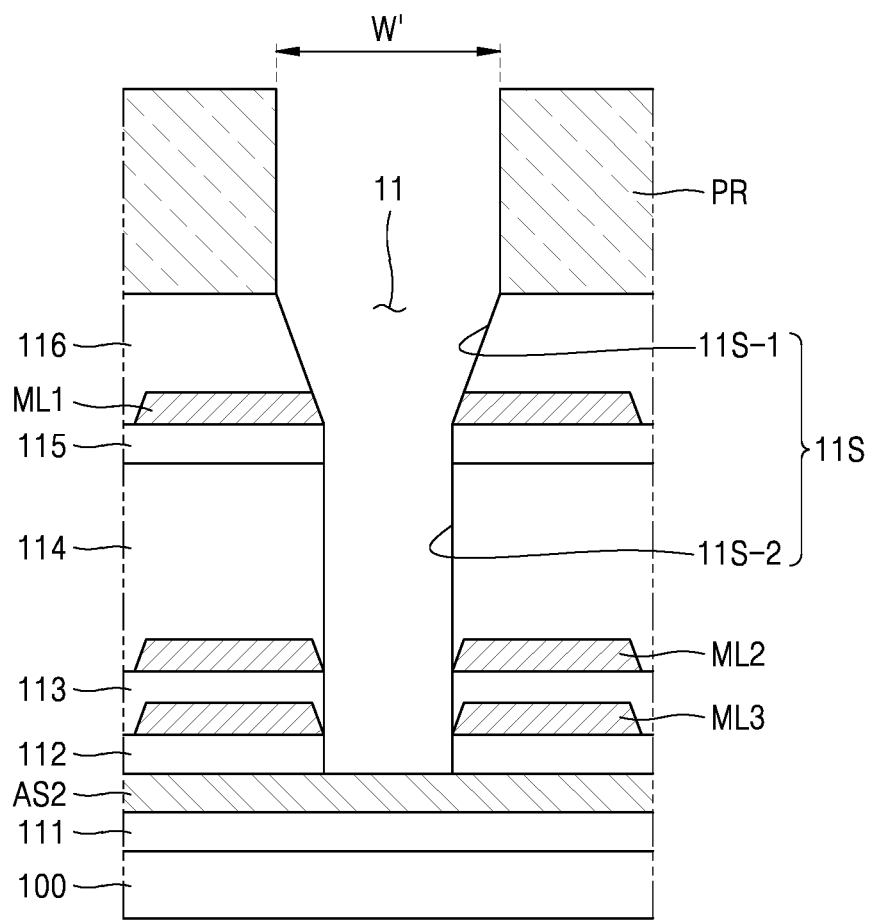

FIGS. 15A and 15B are schematic cross-sectional views of some operations of a method of manufacturing a display apparatus, according to an embodiment. FIGS. 15A and 15B illustrate the operations of forming the first contact hole 11.

Referring to FIG. 15A, after the buffer layer 111 to the second interlayer insulating layer 116 are formed on the substrate 100, a photoresist PR may be formed on the second interlayer insulating layer 116. The photoresist PR may be formed through deposition, exposure, and development.

The photoresist PR may include a suitable pattern (e.g., a predetermined pattern) for forming the contact holes. For example, the pattern of the photoresist PR may include an opening having a suitable width (e.g., a predetermined width) W for forming the first contact hole 11 (e.g., see FIG. 6A). In other words, the opening is formed at a location where the first contact hole 11 is to be formed, and the opening may have the width (e.g., the predetermined width) W. Each of the first to third metal layers ML1 to ML3 located below the second interlayer insulating layer 116 may also include an opening at a location where the first contact hole 11 is to be formed. The opening of the photoresist PR may overlap with the openings of the first to third metal layers ML1 to ML3.

Referring to FIG. 15B, dry etching may be performed by using the photoresist PR as an etching mask. Through the dry etching, portions of the insulating layers overlapping with the opening of the photoresist PR may be removed, and the first contact hole 11 may be formed.

An etching gas containing reactive ions may be used for the dry etching. The photoresist PR, which is the etching mask, may have a relatively poor etch resistance to reactive ions, and thus, a small amount of the photoresist PR may be removed by the etching, resulting in a loss. Thus, a width W of the opening of the photoresist PR may increase after the etching when compared to the width W prior to the etching. On the other hand, the first to third metal layers ML1 to ML3 functioning as hard masks may include a metal, and thus, may have a greater etch resistance to reactive ions than that of the photoresist PR. Therefore, the first to third metal layers ML1 to ML3 may function as the hard masks without loss due to the etching.

As a result, the width of the first contact hole 11 may gradually increase from the first metal layer ML1 to the photoresist PR on a cross-section, and the first portion 11S-1 of the inner surface 11S of the first contact hole 11 may be tapered. On the other hand, a portion of the first contact hole 11 located below the first metal layer ML1 may have a structure in which a relatively smaller width is maintained.

FIGS. 16A to 16F are schematic plan views of a portion of a display apparatus, according to one or more embodiments. FIGS. 16A through 16F illustrate the arrangement of the first contact hole 11 and the first metal layer ML1 on a plane (e.g., in a plan view), and for convenience of illustration, the insulating layers that are arranged on the third gate insulating layer 115 and the first conductive layer CL1 (e.g., see FIG. 4) are not illustrated.

Figure 16A:
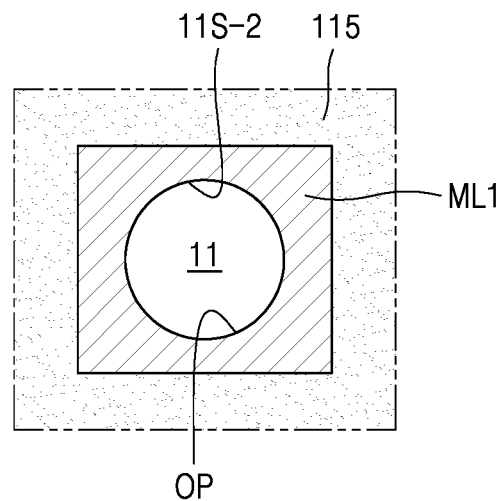
FIGS. 16A-16F are schematic plan views of a portion of a display apparatus, according to one or more embodiments.
Figure 16B:
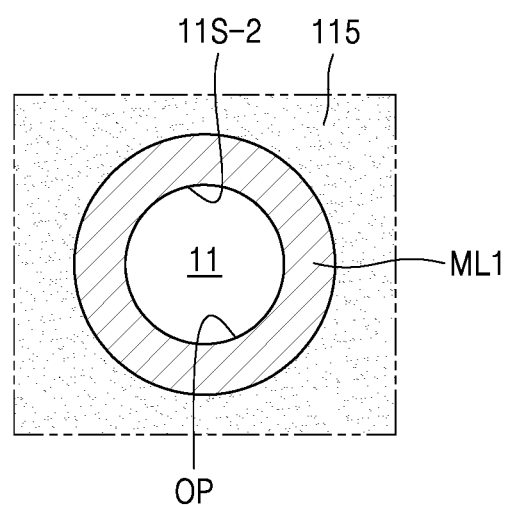
Figure 16C:
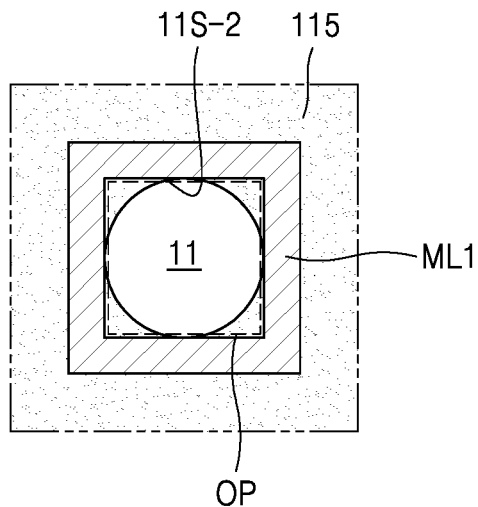

Referring to FIGS. 16A to 16C, the first metal layer ML1 may include an opening OP on a plane (e.g., in a plan view). The opening OP of the first metal layer ML1 may overlap with the first contact hole 11. In this case, the opening OP is a penetrating region in which an etchant or an etching gas may pass through the first metal layer ML1 during an etching process, and may be defined as a region that is entirely or partially surrounded (e.g., around a periphery thereof) by the first metal layer ML1.

In an embodiment, the first metal layer ML1 may entirely surround (e.g., around a periphery of) the opening OP, and an inner edge of the first metal layer ML1 may define an edge of the opening OP. For example, the edge of the opening OP of the first metal layer ML1 may have a closed-loop shape on a plane (e.g., in a plan view).

As an example, as shown in FIGS. 16A and 16B, the edge of the opening OP of the first metal layer ML1 may have a circular shape or an elliptical shape. As another example, as shown in FIG. 16C, the edge of the opening OP of the first metal layer ML1 may have a quadrangular shape. However, the present disclosure is not limited thereto, and the edge of the opening OP of the first metal layer ML1 may have various suitable shapes, for example, such as a triangle shape, a pentagon shape, and/or the like.

As shown in FIGS. 16A and 16C, an outer edge of the first metal layer ML1 may have a quadrangular shape on a plane (e.g., in a plan view). As another example, as shown in FIG. 16B, the outer edge of the first metal layer ML1 may have a circular shape or an elliptical shape. However, the present disclosure is not limited thereto, and the outer edge of the first metal layer ML1 may have various suitable shapes, for example, such as a triangle shape, a pentagon shape, and/or the like.

Figure 16D:
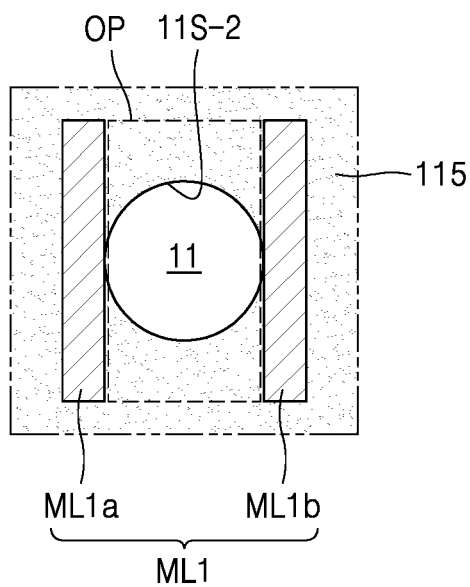
Figure 16E:
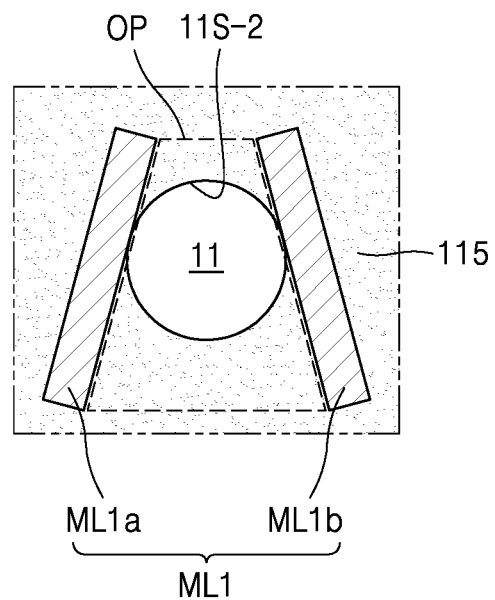
Figure 16F:
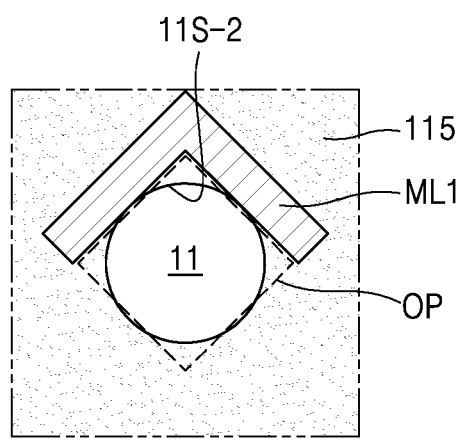

Referring to FIGS. 16D to 16F, the first metal layer ML1 may include the opening OP overlapping with the first contact hole 11 on a plane (e.g., in a plan view), and the first metal layer ML1 may partially surround (e.g., around a periphery of) the opening OP.

In an embodiment, as shown in FIGS. 16D and 16E, the first metal layer ML1 may include a first portion ML1a and a second portion ML1b that are arranged opposite to each other with respect to the opening OP. Each of the first portion ML1a and the second portion ML1b of the first metal layer ML1 may have a quadrangular shape on a plane (e.g., in a plan view), but the present disclosure is not limited thereto. In another embodiment, as shown in FIG. 16F, the first metal layer ML1 may have a bent shape to partially surround (e.g., around a periphery of) the opening OP on a plane (e.g., in a plan view).

Accordingly, while minimizing or reducing an area in which the first metal layer ML1 is arranged, it may be possible to precisely control the first contact hole 11 from increasing in a specific direction.

Also, when the first metal layer ML1 entirely surrounds (e.g., around a periphery of) the opening OP, the opening OP may be accurately aligned at a location where the first contact hole 11 is to be formed, and thus, a difficulty in the process of forming the opening OP may increase. However, the first metal layer ML1 may partially surround (e.g., around a periphery of) the opening OP, and thus, the difficulty in the above-described process may be reduced.

While the shape and arrangement of the first metal layer ML1 have been described in more detail with reference to FIGS. 16A to 16F, the shape and/or the arrangement thereof may be applied to all of the metal layers ML (e.g., see FIGS. 4 and 5) in the same or substantially the same manner.

In the above, a display apparatus has been mainly described, but the present disclosure is not limited thereto. For example, it may be understood that methods of manufacturing such a display apparatus also fall within the scope of the present disclosure.

According to one or more embodiments of the present disclosure described above, the size of the contact holes may be precisely controlled, and may be minimized or reduced through the arrangement of a metal layer without using a separate hard mask. Accordingly, the elements of the display apparatus may be highly integrated, and thus, a high-resolution display apparatus may be implemented. Also, by using an oxide semiconductor layer, the display apparatus in which power consumption is reduced may be implemented. However, the spirit and scope of the present disclosure are not limited by the aforementioned aspects and features.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display apparatus comprising:
   a substrate;
   a first semiconductor layer on the substrate, and comprising a silicon semiconductor;
   a second semiconductor layer on the first semiconductor layer, and comprising an oxide semiconductor;
   a first conductive layer on the second semiconductor layer;
   at least one metal layer between the first semiconductor layer and the first conductive layer; and
   a first contact hole configured to electrically connect the first semiconductor layer to the first conductive layer,
   wherein an inner surface of the first contact hole comprises a side surface of the at least one metal layer,
   wherein the display apparatus further comprises a first gate electrode on the second semiconductor layer,
   wherein the at least one metal layer comprises a first metal layer at a same layer as that of the first gate electrode,
   wherein the display apparatus further comprises a second gate electrode below the second semiconductor layer, and
   wherein the at least one metal layer further comprises a second metal layer at a same layer as that of the second gate electrode.

2. The display apparatus of claim 1, further comprising a third gate electrode on the first semiconductor layer, wherein the at least one metal layer comprises a third metal layer at a same layer as that of the third gate electrode.

3. The display apparatus of claim 1, wherein the inner surface of the first contact hold comprises a first portion on the at least one metal layer, and a second portion below the at least one metal layer,
   wherein the first portion of the inner surface has a tapered shape.

4. The display apparatus of claim 3, wherein an angle of the first portion of the inner surface with respect to a surface of the substrate is different from an angle of the second portion of the inner surface with respect to the surface of the substrate.

5. The display apparatus of claim 1, wherein the first conductive layer contacts the side surface of the at least on metal layer in the first contact hole.

6. The display apparatus of claim 1, wherein the at least one metal layer is electrically floated.

7. The display apparatus of claim 1, wherein the at least one metal layer has an opening overlapping with the first contact hole, and an edge of the opening of the at least one metal layer has a closed-loop shape on a plane.

8. The display apparatus of claim 1, wherein the at least one metal layer has an opening overlapping with the first contact hole, and the at least one metal layer comprises a first portion, and a second portion opposite to the first portion with respect to a center of the opening of the at least one metal layer on a plane.

9. The display apparatus of claim 1, wherein the at least one metal layer has an opening overlapping with the first contact hole, and the at least one metal layer has a bent shape to partially surround the opening of the at least one metal layer on a plane.

10. The display apparatus of claim 1, further comprising:
    a second conductive layer at a same layer as that of the first conductive layer;
    a first electrode at a same layer as that of the second gate electrode; and
    a second contact hole configured to electrically connect the second conductive layer to the first electrode,
    wherein an inner surface of the second contact hole comprises a side surface of the at least one metal layer.

11. The display apparatus of claim 1, further comprising:
    a third conductive layer at a same layer as that of the first conductive layer; and
    a third contact hole configured to electrically connect the third conductive layer to the second semiconductor layer,
    wherein an inner surface of the third contact hole comprises a side surface of the at least one metal layer.

12. The display apparatus of claim 11, wherein the first conductive layer and the third conductive layer are integrated with each other as one body.

13. A display apparatus comprising:
    a substrate;
    a first semiconductor layer on the substrate;
    a first insulating layer on the first semiconductor layer;
    a second semiconductor layer on the first insulating layer, and comprising a material different from that of the first semiconductor layer;
    a second insulating layer on the second semiconductor layer;
    a conductive layer on the second insulating layer;
    a first contact hole configured to electrically connect the first semiconductor layer to the conductive layer; and a metal layer between the first semiconductor layer and the conductive layer, the metal layer having an opening overlapping with the first contact hole, wherein the conductive layer is in contact with a side surface of the metal layer the first contact hole, wherein the display apparatus further comprises a first gate electrode between the second semiconductor layer and the conductive layer, wherein the metal layer comprises a same material as that of the first gate electrode, and wherein the display apparatus further comprises:
  a second gate electrode between the first semiconductor layer and the second semiconductor layer; and
  a second metal layer comprising a same material as that of the second gate electrode.

14. The display apparatus of claim 13, wherein the first semiconductor layer comprises a silicon semiconductor layer, and the second semiconductor layer comprises an oxide semiconductor layer.

15. The display apparatus of claim 13, wherein the conductive layer contacts a side surface of the second metal layer in the first contact hole.

16. The display apparatus of claim 13, further comprising:
  a third gate electrode between the first semiconductor layer and the second semiconductor layer, the third gate electrode being at a different layer from that of the second gate electrode; and
  a third metal layer comprising a same material as that of the third gate electrode.

17. The display apparatus of claim 16, wherein the conductive layer contacts a side surface of the third metal layer in the first contact hole.

18. The display apparatus of claim 13, wherein a side surface of the first contact hole comprises a side surface of the first insulating layer, and a side surface of the second insulating layer,
  wherein the side surface of the second insulating layer is on the metal layer, and has a tapered shape.

19. The display apparatus of claim 18, wherein the side surface of the first insulating layer is below the metal layer, and is located farther from a center of the first contact hole than the side surface of the metal layer.

20. The display apparatus of claim 18, wherein an angle of the side surface of the first insulating layer with respect to one surface of the substrate is different from an angle of the side surface of the second insulating layer with respect to the one surface of the substrate.

21. The display apparatus of claim 13, wherein an edge of the opening of the metal layer has a closed-loop shape on a plane.

22. The display apparatus of claim 13, wherein the metal layer comprises a first portion, and a second portion opposite to the first portion with respect to a center of the opening of the metal layer on a plane.

23. The display apparatus of claim 13, wherein the metal layer has a bent shape to partially surround the opening of the metal layer on a plane.

* * * * *